United States Patent
Matsuo et al.

(10) Patent No.: US 6,757,037 B2
(45) Date of Patent: Jun. 29, 2004

(54) ELECTRO-OPTIC DEVICE, MANUFACTURING METHOD THEREFOR, AND ELECTRONIC EQUIPMENT

(75) Inventors: Mutsumi Matsuo, Suwa (JP); Keiji Takizawa, Suwa (JP); Kenichi Honda, Suwa (JP)

(73) Assignee: Seiko Epson Corporation (JP)

( * ) Notice: Subject to any disclaimer, the term of this patent is extended or adjusted under 35 U.S.C. 154(b) by 24 days.

(21) Appl. No.: 10/137,656

(22) Filed: Apr. 30, 2002

(65) Prior Publication Data

US 2002/0167743 A1 Nov. 14, 2002

(30) Foreign Application Priority Data

May 1, 2001 (JP) ........................................ 2001-134500
Apr. 4, 2002 (JP) ........................................ 2002-102946

(51) Int. Cl.[7] .......................................... G02F 1/1335
(52) U.S. Cl. ...................................... 349/113; 349/109
(58) Field of Search ................. 349/113–114, 106–109, 349/42–43

(56) References Cited

U.S. PATENT DOCUMENTS 6,259,499 B1 * 7/2001 Yamanashi .................. 349/113
6,618,107 B1 * 9/2003 Tanaka et al. ............... 349/106
2002/0113926 A1 * 8/2002 Hanazawa et al. .......... 349/113
2003/0142247 A1 * 7/2003 Nishiyama et al. ........... 349/67

FOREIGN PATENT DOCUMENTS

JP 11-258587 * 9/1999
JP 11-281967 * 10/1999

* cited by examiner

*Primary Examiner*—Dung Nguyen
(74) *Attorney, Agent, or Firm*—Harness, Dickey & Pierce, P.L.C.

(57) ABSTRACT

A liquid crystal display device is provided with a plurality of color filters 12R, 12G, and 12B corresponding to colors of red base, green base, and blue base, respectively, and a reflection layer 22 placed on the side opposite to observation side with respect to a liquid crystal and color filters 12. A plurality of fine crest portions and trough portions are formed on the surface of the reflection layer 22. In the reflection layer 22, the mirror reflectivity of the region facing the color filter of at least one color is different from the mirror reflectivities of the regions facing the color filters of the other colors. Specifically, the mirror reflectivity of the region facing the blue-based color filter 12B in the reflection layer 22 is higher than the mirror reflectivities of the regions facing the red-based and green-based color filters 12R and 12G in the reflection layer 22.

27 Claims, 19 Drawing Sheets

FIG. 10
(a)
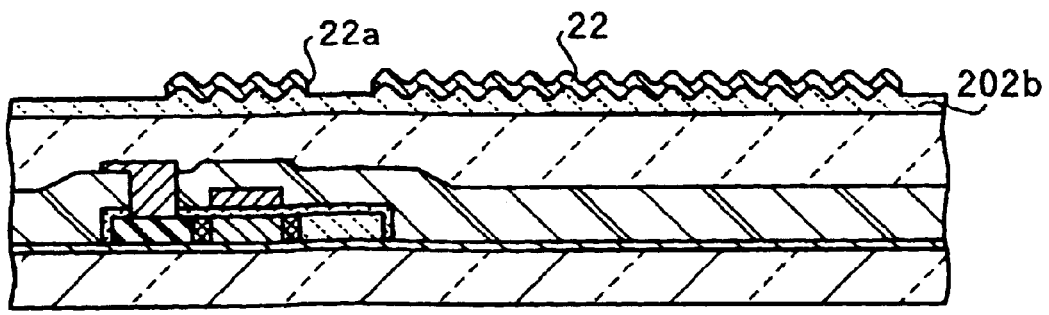
(b)
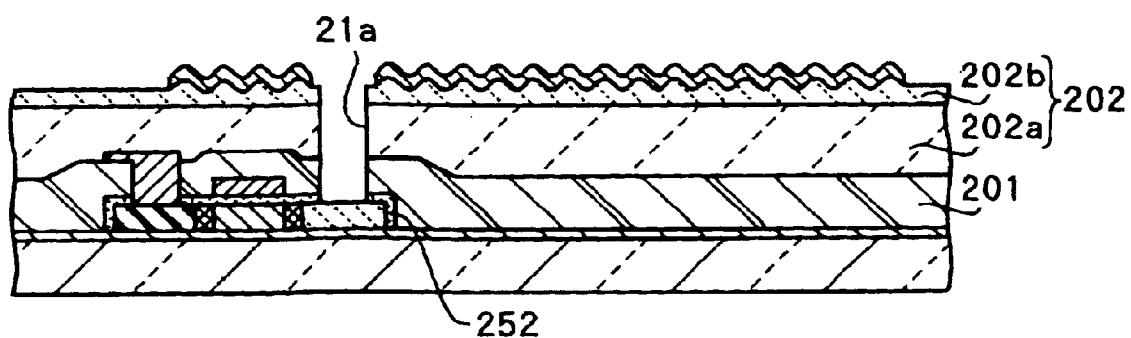
(c)
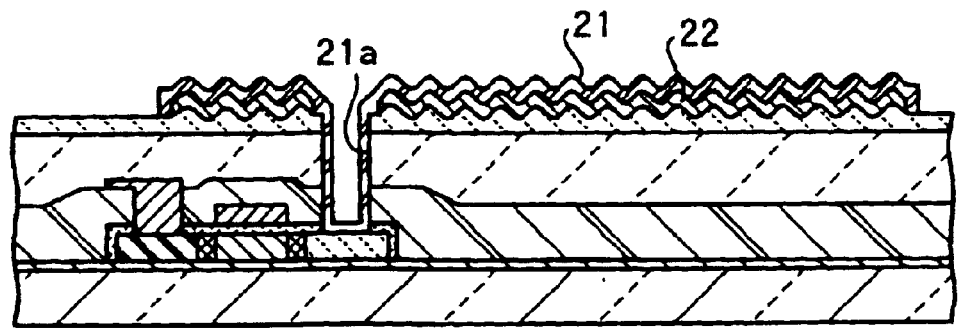

ELECTRO-OPTIC DEVICE, MANUFACTURING METHOD THEREFOR, AND ELECTRONIC EQUIPMENT

BACKGROUND OF THE INVENTION

1. Technical Field of the Invention

The present invention relates to an electro-optic device, for example, a liquid crystal display device and an EL device, to a manufacturing method for the electro-optic device, and to electronic equipment using the electro-optic device.

2. Description of the Related Art

The liquid crystal display device, which is an example of the electro-optic devices, generally has a configuration in which a pair of substrates made of a glass substrate, etc., are adhered to each other with a seal member therebetween, and a liquid crystal is encapsulated between the both substrates. Furthermore, a liquid crystal display device including color filters matching a plurality of colors, for example, R (red base), G (green base), and B (blue base), and a reflection layer placed on the side opposite to the observation side with respect to the liquid crystal has been known. In the reflective liquid crystal display device of this kind, external light, for example, sunlight and room illumination light, incident from a substrate on the observation side is reflected at the surface of the reflection layer, and is emitted to the observation side after passing through the color filter. This emission light is visually identified by an observer as a color image.

However, the sensitivity of the human eye (that is, spectral luminous efficacy) varies depending on each wavelength within the visible-light region. More specifically, the human eye has a characteristic that the sensitivity is high with respect to the light having a wavelength on the order of 550 nm corresponding to green-based light, but on the other hand, the sensitivity is low with respect to the light having other wavelengths. Therefore, there has been a problem in that the observer has felt unevenness in the color balance in such a manner, for example, even when the light having been passed through a color filter of each color of blue-based, red-based, and green-based, and having been emitted to the observation side has had the same quantity of light, the blue base and the red base has appeared dark compared to the green base. This problem is a problem that may also occur in a so-called semitransparent reflective liquid crystal display device capable of transmissive display in addition to reflective display.

The present invention has been made in consideration of the aforementioned circumstances. Accordingly, the object of the present invention is to provide an electro-optic device, in which the intensity of the light detected by an observer can be adjusted with respect to each wavelength within the visible-light region, a manufacturing method therefor, and electronic equipment.

SUMMARY OF THE INVENTION

In order to achieve the aforementioned objects, an electro-optic device according to the present invention includes a plurality of color filters, each having a different color, and a reflection layer in which the surface shape of the region facing at least one of the aforementioned color filters and the surface shapes of the regions facing the other aforementioned color filters are different.

According to this electro-optic device, by differentiating the surface shapes of the regions facing the color filters of respective colors in the reflection layer, the mode of reflection in each region, for example, the degree of scattering on the reflection layer surface, etc., can be changed arbitrarily. Therefore, the color balance of display visually identified by the observer can be arbitrarily selected by adjusting the quantity of light visually identified by the observer with respect to each wavelength corresponding to the color of the color filter.

(2) In the electro-optic device having the aforementioned configuration, the mirror reflectivity of the aforementioned region facing the aforementioned at least one of the aforementioned color filters can be differentiated from the mirror reflectivities of the aforementioned regions facing the other aforementioned color filters.

According to this, regarding the region having a high mirror reflectivity in the reflection layer, since scattering on the surface thereof can be suppressed and the quantity of light mirror-reflected can be increased, well-lighted display can be realized with respect to the color of the color filter facing the aforementioned region. On the other hand, regarding the region having a low mirror reflectivity, since scattering on the surface thereof can be accelerated and the quantity of light mirror-reflected can be reduced, brightness of display can be reduced with respect to the color of the color filter facing the aforementioned region.

(3) In the electro-optic device having the aforementioned configuration, a plurality of crest portions and a plurality of trough portions can be formed on the surface of the aforementioned reflection layer, in which the shapes thereof in the aforementioned region facing the aforementioned at least one of the aforementioned color filters are different from the shapes thereof in the aforementioned regions facing the other aforementioned color filters.

According to this configuration, the scattering characteristic on each region in the reflection layer can be differentiated without being attended with complication of the configuration. Therefore, the quantity of light visually identified by the observer can be adjusted in accordance with a wavelength corresponding to the color of each color filter.

(4) In the electro-optic device having the aforementioned configuration, the average value of the pitches defined as the distance between the top of one of the crest portions and the top of other crest portion adjacent to the crest portion in the region facing the aforementioned at least one of the aforementioned color filters can be differentiated from those in the aforementioned regions facing the other aforementioned color filters.

In this case, regarding the region having a large average value of the pitches, since scattering on the surface thereof can be suppressed and the quantity of light emitted to the observer side can be increased, well-lighted display can be achieved with respect to the color corresponding to the aforementioned region. Conversely, regarding the region having a small average value of the pitches, since scattering on the surface thereof is accelerated and the quantity of light visually identified by the observer is reduced, intensity can be reduced with respect to the color corresponding to the aforementioned region.

(5) In the electro-optic device having the aforementioned configuration, the aforementioned depths of the trough portions can be made substantially the same in the regions facing the aforementioned plurality of color filters in the aforementioned reflection layer.

(6) In the electro-optic device having the aforementioned configuration, the aforementioned average value of the depths of the trough portions in the aforementioned region facing the at least one of the aforementioned color filters can be differentiated from those in the aforementioned regions facing the other aforementioned color filters.

In this case, regarding the region having a small average value of the depths of the trough portions, since scattering on the surface thereof can be suppressed and the quantity of light emitted to the observer side can be increased, well-lighted display can be achieved with respect to the color corresponding to the aforementioned region. Conversely, regarding the region having a large average value of the depths of the trough portions, since scattering on the surface thereof is accelerated and the quantity of light visually identified by the observer is reduced, intensity can be reduced with respect to the color corresponding to the aforementioned region.

(7) In the electro-optic device having the aforementioned configuration, in which the average values of the depths of the trough portions are made to differentiate with respect to each region facing the color filter, the pitches defined as the distance between the top of one of the aforementioned crest portions and the top of other aforementioned crest portion adjacent to the crest portion can be made substantially the same in the regions facing the aforementioned color filters in the aforementioned reflection layer.

(8) In the electro-optic device having the aforementioned configuration, in which a plurality of crest portions and trough portions are formed on the surface of the reflection layer, the average value of the inclinations between the surface of a substrate and the direction from the top of the aforementioned crest portion toward the bottom of the trough portion adjacent to the crest portion in the aforementioned region facing the aforementioned at least one of the aforementioned color filters can be differentiated from those in the aforementioned regions facing the other aforementioned color filters.

In this case, regarding the region having a small average value of the inclinations, since scattering on the surface thereof can be suppressed and the quantity of light emitted to the observer side can be increased, well-lighted display can be achieved with respect to the color corresponding to the aforementioned region. Conversely, regarding the region having a large average value of the inclinations, since scattering on the surface thereof is accelerated and the quantity of light visually identified by the observer is reduced, intensity can be reduced with respect to the color corresponding to the aforementioned region.

(9) Another electro-optic device according to the present invention includes (I) a red-based color filter, (II) a green-based color filter, (III) a blue-based color filter, and (IV) a reflection layer including a first region facing the aforementioned red-based color filter, a second region facing the aforementioned green-based color filter, and a third region facing the aforementioned blue-based color filter, wherein (V) the surface shape of the aforementioned third region is different from each surface shape of the aforementioned first region and the aforementioned second region, and (VI) the mirror reflectivity of the aforementioned third region is higher than each of the mirror reflectivities of the aforementioned first region and the aforementioned second region.

In general, the spectral luminous efficacy of the human eye varies depending on light of each wavelength within the visible-light region. In particular, the spectral luminous efficacy with respect to green-based light is usually remarkably higher than the spectral luminous efficacy with respect to blue-based light. Therefore, when the mirror reflectivity of the region corresponding to the blue base in the reflection layer is made higher than the mirror reflectivities of the regions corresponding to the red base and the green base as in the aforementioned configuration, it is possible to hinder the color balance in display detected by the observer from becoming uneven due to the difference in the spectral luminous efficacy.

(10) In the electro-optic device having the aforementioned configuration, in which the mirror reflectivity of the third region corresponding to the blue base is made higher, the mirror reflectivity of the aforementioned first region corresponding to the red base can be made higher than the mirror reflectivity of the aforementioned second region corresponding to the green base.

In general, the spectral luminous efficacy with respect to red-based light is lower than the spectral luminous efficacy with respect to green-based light. Therefore, when the mirror reflectivity of the region corresponding to the red base in the reflection layer is made higher than the mirror reflectivity of the region corresponding to the green base, it is possible to make the color balance in display due to the difference in the spectral luminous efficacy even.

(11) In the electro-optic device having the aforementioned configuration, in which the values of mirror reflectivity are made to vary in accordance with each color, (I) a plurality of crest portions and a plurality of trough portions can be formed in the aforementioned first region, the aforementioned second region, and the aforementioned third region on the surface of the aforementioned reflection layer, (II) the depths of the aforementioned trough portions can be made substantially the same in the aforementioned first region, the aforementioned second region, and the aforementioned third region, (III) the pitch is defined as the distance between the top of one of the aforementioned crest portions and the top of other crest portion adjacent to the crest portion, and (IV) the average value of the pitches in the aforementioned third region can be made larger than each of the average values of the pitches in the aforementioned first region and the aforementioned second region.

In general, the spectral luminous efficacy of the human eye generally becomes highest with respect to green-based light, and is reduced with respect to red base and blue base in that order. Therefore, from the viewpoint of ensuring evenness in the color balance in display detected by the observer, it is desirable that the average value of the pitches in the third region corresponding to the blue base is made larger than the average values of the pitches in the other regions as in the aforementioned configuration.

(12) In the electro-optic device having the aforementioned configuration, in which the average value of the pitches in the third region corresponding to the blue base is made large, furthermore, the average value of the pitches in the aforementioned first region corresponding to the red base can be made larger than the average value of the pitches in the aforementioned second region corresponding to the green base.

(13) In the electro-optic device having the aforementioned configuration, (I) a plurality of crest portions and a plurality of trough portions are formed in the aforementioned first region, the aforementioned second region, and the aforementioned third region on the surface of the aforementioned reflection layer, (II) the average value of the depths of the aforementioned trough portions in the aforementioned third region is made smaller than each of the average values of the depths of the trough portions in the aforementioned first region and the aforementioned second region and, furthermore, (III) the pitches defined as the distance between the top of one of the aforementioned crest portions and the top of other aforementioned crest portion adjacent to the crest portion can be set at substantially the same in the aforementioned first region, the aforementioned second region, and the aforementioned third region.

According to this configuration, by making the average value of the depths of the trough portions in the region facing the blue-based color filter in the reflection layer smaller than the average values of the depths of the trough portions in the regions facing the red-based and green-based color filters in the reflection layer, the color balance in display detected by the observer can be evened.

(14) In the electro-optic device having the aforementioned configuration, in which the average value of the depths of the trough portions in the third region corresponding to the blue base is set to be small, furthermore, the aforementioned average value of the depths of the trough portions in the first region corresponding to the red base can be made smaller than the aforementioned average value of depths of the trough portions in the second region corresponding to the green base.

(15) In the electro-optic device having the aforementioned configuration, when the angle between the surface of the aforementioned substrate and the direction from the top of the aforementioned crest portion toward the bottom of the trough portion adjacent to the crest portion is defined as inclination, the average value of the inclinations in the aforementioned third region can be made smaller than the average values of the inclinations in the aforementioned first region and the aforementioned second region. According to this, the color balance in display detected by the observer can be evened.

(16) In the electro-optic device having the aforementioned configuration, in which the average value of the inclinations in the third region corresponding to the blue base is made small, furthermore, the average value of the inclinations in the aforementioned first region can be made smaller than the average value of the inclinations in the aforementioned second region.

(17) Electronic equipment according to the present invention is provided with the electro-optic device having the aforementioned configurations. As described above, since the quantity of light having a wavelength corresponding to each color of the color filters can be adjusted by the electro-optic device according to the present invention, unevenness in the color balance is suppressed and excellent display is realized in the electronic equipment provided with this electro-optic device.

(18) A manufacturing method for an electro-optic device according to the present invention provided with a surface shape, a reflection layer placed on the aforementioned surface shape, and a plurality of color filters, each having a different color, placed on the aforementioned reflection layer, includes the step of forming the aforementioned surface shape, the step of forming the reflection layer on the aforementioned surface shape in order to cover the aforementioned surface shape and the step of forming the aforementioned plurality of color filters on the aforementioned reflection layer, wherein the aforementioned surface shape of the region facing at least one of the aforementioned color filters and the aforementioned surface shapes of the regions facing the other aforementioned color filters are different.

According to the electro-optic device obtained by this manufacturing method, since the quantity of light visually identified by the observer can be adjusted with respect to each wavelength corresponding to the color of the color filter, the color balance in display visually identified by the observer can be selected arbitrarily.

(19) In the manufacturing method for the electro-optic device having the aforementioned configuration, in the step of forming the aforementioned surface shape, (I) a resin layer including a plurality of crest portions and a plurality of trough portions on the surface thereof is formed, and (II) the aforementioned surface shape of the region facing the aforementioned at least one of the aforementioned color filters and those of the regions facing the other aforementioned color filters are different in the resin layer.

According to this, the surface of the reflection layer formed on the surface of the resin layer can be made into the shape incorporated with the crest portions and trough portions on the resin layer surface. That is, by using the resin layer capable of being processed with ease, the electro-optic device, in which the color balance in display visually identified by the observer has been adjusted, can be manufactured without the need for complicated manufacturing steps.

(20) In the manufacturing method for the electro-optic device having the aforementioned configuration, in the step of forming the aforementioned surface shape, the aforementioned resin layer can be formed in order that the average value of the pitches, which is the distance between the top of one of the aforementioned crest portions and the top of other crest portion adjacent to the crest portion, in the region facing the aforementioned at least one of the aforementioned color filters is different from those in the regions facing the other aforementioned color filters.

(21) Furthermore, in the manufacturing method for the electro-optic device having the aforementioned configuration, in the step of forming the aforementioned surface shape, the aforementioned resin layer can be formed in order that the aforementioned average value of the depths of the trough portions in the region facing the aforementioned at least one of the aforementioned color filters is different from those in the regions facing the other aforementioned color filters.

BRIEF DESCRIPTION OF THE DRAWINGS

FIG. 10 is a diagram showing steps on the back of the steps shown in FIG. 9 by using sectional views of the liquid crystal display device in order of performance.

DETAILED DESCRIPTION OF THE PREFERRED EMBODIMENTS OF THE INVENTION

Figure 1:
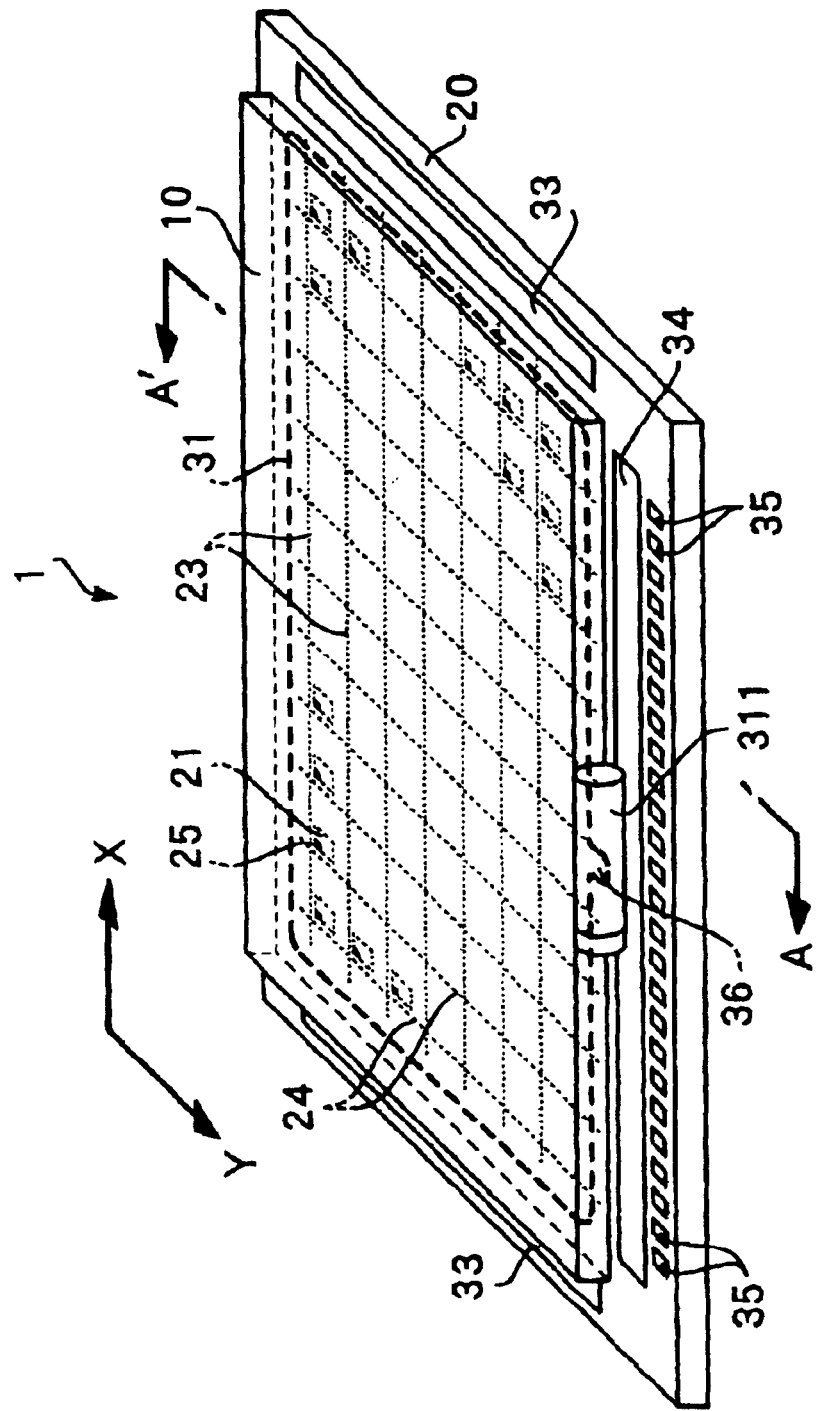
FIG. 1 is a perspective view showing an embodiment in the case where the present invention is applied to a liquid crystal display device which is an example of the electro-optic device according to the present invention.

Embodiments according to the present invention will be described below with reference to the drawings. This embodiment shows one mode of the present invention, does not limit the present invention, and can be arbitrarily changed in the scope of the present invention. Regarding each drawing described below, the scale is varied with respect to each layer or each member in order that each layer or each member has the size capable of being identified in the drawing.

(First Embodiment of the electro-optic device)

An embodiment in the case where the present invention is applied to a liquid crystal display device, which is an example of electro-optic devices, especially to a reflective liquid crystal display device of active matrix system, will be described. This liquid crystal display device is provided with a TFT (Thin Film Transistor), which is a three-terminal type nonlinear element, as a nonlinear (switching) element.

Figure 2:
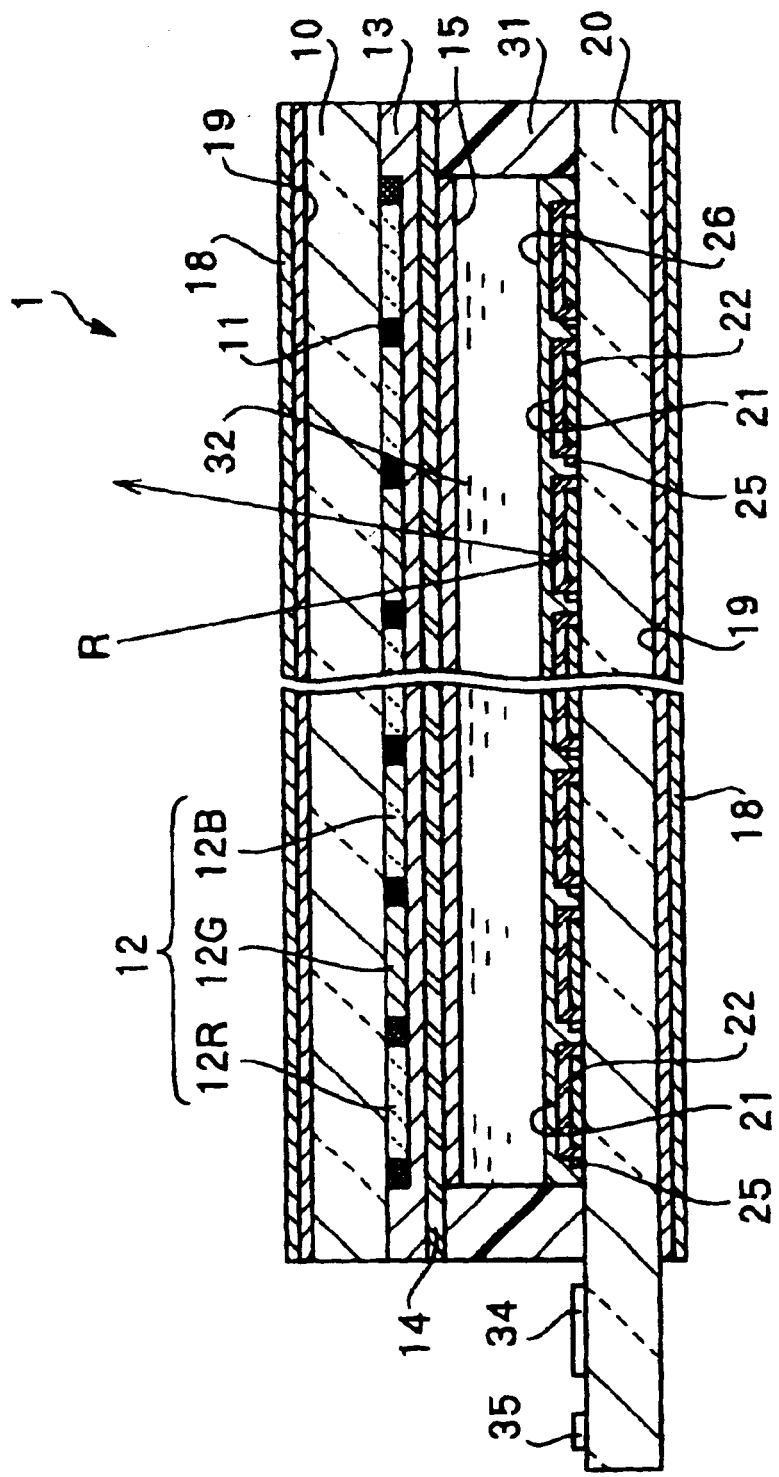
FIG. 2 is a sectional view of the section indicated by line A–A' shown in FIG. 1.

FIG. 1 shows the configuration of a liquid crystal display device according to the present embodiment. FIG. 2 shows a cross-sectional structure of the liquid crystal display device along the line A–A' shown in FIG. 1. As shown in these drawings, the liquid crystal display device 1 has the configuration in which a first substrate 10 and a second substrate 20 facing each other are adhered with a seal member 31 therebetween, and a liquid crystal 32 of, for example, TN (Twisted Nematic) type, is encapsulated in the region surrounded by both substrates and the seal member 31.

The seal member 31 is formed nearly in the shape of a rectangular frame along the margin of the first substrate 10, and an opening 36 for encapsulating the liquid crystal 32 is included at a part thereof. Consequently, after the liquid crystal 32 is encapsulated, the opening 36 is sealed with a seal member 311. On the external surfaces (that is, the surfaces on the side opposite to the liquid crystal 32 side) of the first substrate 10 and the second substrate 20, polarizing plates 18 for polarizing incident light, phase difference plates 19 for compensating the interference color, etc., are adhered appropriately.

The first substrate 10 and the second substrate 20 are plate-shaped members made of glass, quartz, plastic, etc., and have light transparency. The first substrate 10 is located on the observation side, that is, on the side of the observer visually identifying the display. On the other hand, the second substrate 20 is located on the side opposite to the observation side (that is, on the backface side). As shown in FIG. 2, a light shield layer 11, a plurality of color filters 12, and overcoat layer 13 are formed on the inner surface of the first substrate 10. The color filters 12 are formed by arranging color filters 12R of R (red), color filters 12G of G (green), and color filters B of B (blue) into a predetermined pattern in a plane.

The light shield layer 11 is formed in the shape of a grid in order to cover the regions other than the regions facing a plurality of pixel electrodes 21 arranged into the shape of a matrix on the second substrate 20 (that is, the regions facing the gap portions of pixel electrodes 21) of the first substrate 10. This light shield layer 11 is made of, for example, metal, e.g., chromium (Cr) and black resin material with carbon black dispersed therein.

The color filter 12 is the layer formed in order to face each pixel electrode 21. This color filter 12 is formed from, for example, an acryl-based or epoxy-based resin material, and is colored in red base (R), green base (G), or blue base (B) by a dye or pigment. More specifically, when the wavelength of the light incident upon the color filter 12 is represented by $\lambda$, the color filter 12R has a peak of transmittance within the wavelength range 600 nm$<\lambda\leq$780 nm in the visible-light region (380 nm to 780 nm), the color filter 12G has a peak of transmittance within the wavelength range 500 nm$\leq\lambda\leq$600 nm in the visible-light region (380 nm to 780 nm), and the color filter 12B has a peak of transmittance within the wavelength range 380 nm$\leq\lambda<$500 nm in the visible-light region (380 nm to 780 nm).

The overcoat layer 13 is formed from, for example, resin material, and serves a function of flattening the unevenness formed due to the light shield layer 11 and the color filters 12 on the first substrate 10. Furthermore, a counter electrode 14 made of a transparent conductive material, for example, ITO (Indium Tin Oxide), is formed over the surface of this overcoat layer 13. The surface of the overcoat layer 13, on which the counter electrode 14 has been formed, is covered with an orientation film 15 made of an organic material, for example, polyimide. The orientation film 15 has been subjected to a rubbing treatment for regulating the orientation direction of the liquid crystal 32 when no voltage is applied.

On the other hand, the second substrate 20 includes a region overhanging the first substrate 10. As shown in FIG. 1, scanning line driving circuits 33 for generating and outputting scanning signals are formed on the respective regions in the positive direction and negative direction of the X axis in this overhanging region. On the other hand, a data line driving circuit 34 for generating and outputting data signals is formed on the region in the positive direction of the Y axis in the overhanging region.

A plurality of mounting terminals 35 are formed on the region in the neighborhood of the margin of the second substrate 20 in the regions located in the positive direction of the Y axis in order that various signals from external circuits, although not shown in the drawing, are input. Consequently, the signals input from the mounting terminals 35 are supplied to the aforementioned scanning line driving circuits 33 and data line driving circuit 34. The aforementioned counter electrode 14 is electrically conducted to the aforementioned mounting terminals 35 with a conduction member placed at least one place of the four corners of the joint portion with the second substrate 20.

On the other hand, a plurality of pixel electrodes 21 are formed in the region facing the first substrate 10 on the inner surface (that is, the surface on the liquid crystal 32 side) of the second substrate 20. These pixel electrodes 21 are nearly rectangle-shaped electrodes formed from a transparent conductive material, for example, ITO. Under the aforementioned configuration, the orientation direction of the liquid crystal 32 held between the pixel electrodes 21 and the counter electrode 14 varies depending on the voltage applied between both electrodes.

A reflection layer 22 is formed on the surface of the second substrate 20 and in the region covered with each pixel electrode 21. This reflection layer 22 is formed from a metal having a light reflection property, for example, aluminum and silver, an alloy primarily containing these metals, etc., and serves a function of reflecting the incident light from the first substrate 10 side. That is, the incident light R from the first substrate 10 side is reflected at the surface of the reflection layer 22, and is emitted from the first substrate 10 side, so that the reflective display can be thereby realized.

As shown in FIG. 2, the color filter 12 of each color formed on the first substrate 10 is made to face the pixel electrode 21 and the reflection layer 22. The surface of the second substrate 20, on which the pixel electrodes 21 and the reflection layers 22 have been formed, is covered with an orientation film 26 similar to the aforementioned orientation film 15.

Figure 3:
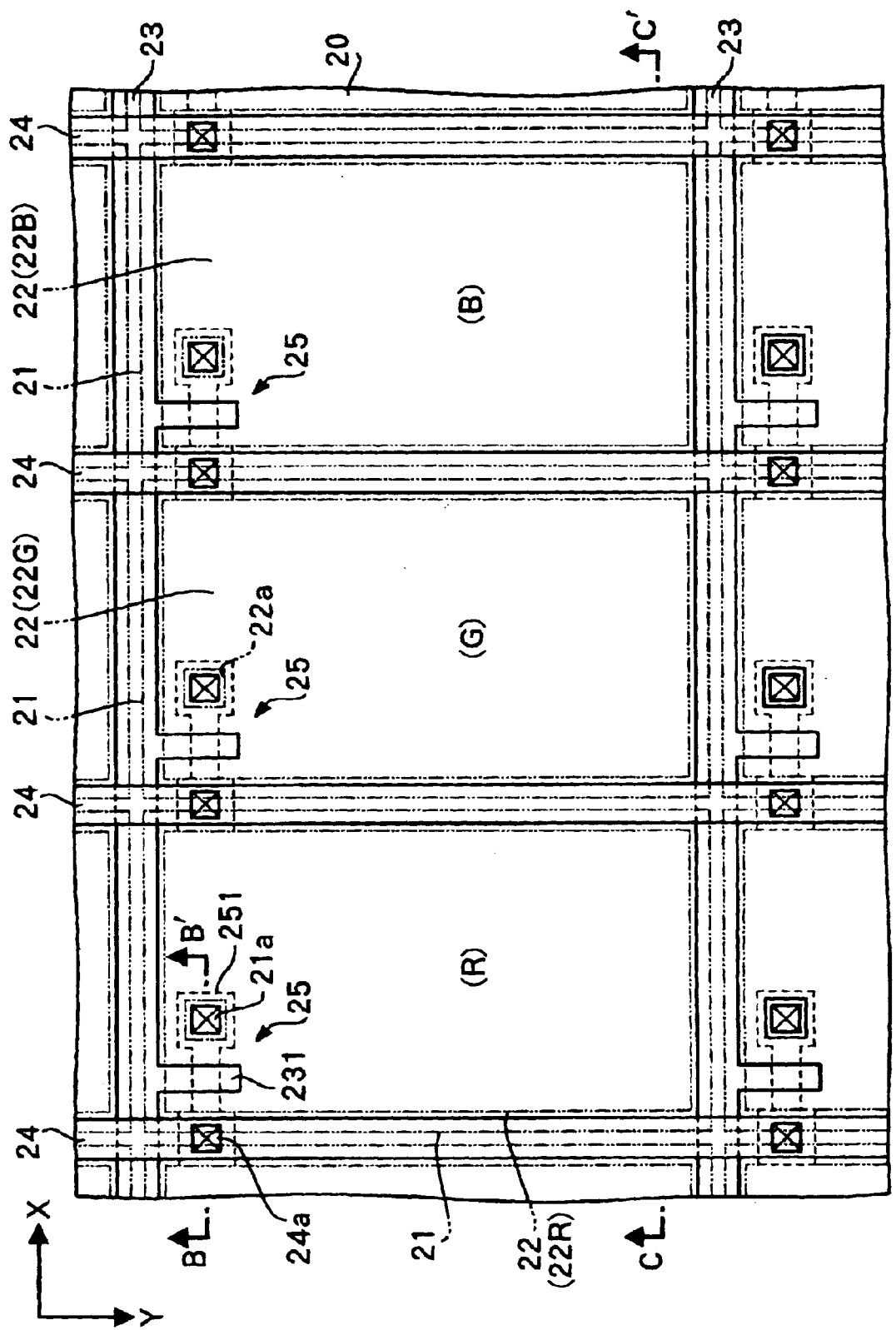
FIG. 3 is a plan view showing the configuration on a second substrate of the liquid crystal display device shown in FIG. 1.

FIG. 3 shows two-dimensionally the configuration in the neighborhood of the region, on which the pixel electrodes 21 are formed, on the second substrate 20. In FIG. 3, as is indicated by each letter "R", "G", and "B", three pixel electrodes 21 facing three color filters 12R, 12G, and 12B of red base, green base, and blue base are shown among the plurality of pixel electrodes 21 formed on the second substrate 20. However, in FIG. 3, it must be noted that the outside shapes of the pixel electrodes 21 and the reflection layers 22 are indicated by chain lines in order to prevent the drawing from being complicated.

In FIG. 3, a plurality of scanning lines 23 extending in the direction of the X axis and a plurality of data lines 24 extending in the direction of the Y axis are placed on the second substrate 20. The scanning signal output from the scanning line driving circuit 33 is supplied to each scanning line 23. On the other hand, the data signal output from the data line driving circuit 34 is supplied to each data line 24. The aforementioned pixel electrodes 21 are placed corresponding to each intersection of the scanning line 23 and the data line 24, and as a whole, are arranged in the shape of a matrix as shown in FIG. 1.

These pixel electrodes 21 are connected to the scanning lines 23 and the data lines 24 with TFTs 25 therebetween. Although only a few scanning lines 23 and data lines 24 are shown at intervals larger than practical intervals in FIG. 1, actually, numbers of scanning lines 23 and the data lines 24 are arranged at small intervals. Although the pixel electrodes 21 are schematically shown in a size larger than a practical size, actually, numbers of smaller dot-shaped pixel electrodes 21 are placed in the shape of a matrix over the display region.

Figure 4:
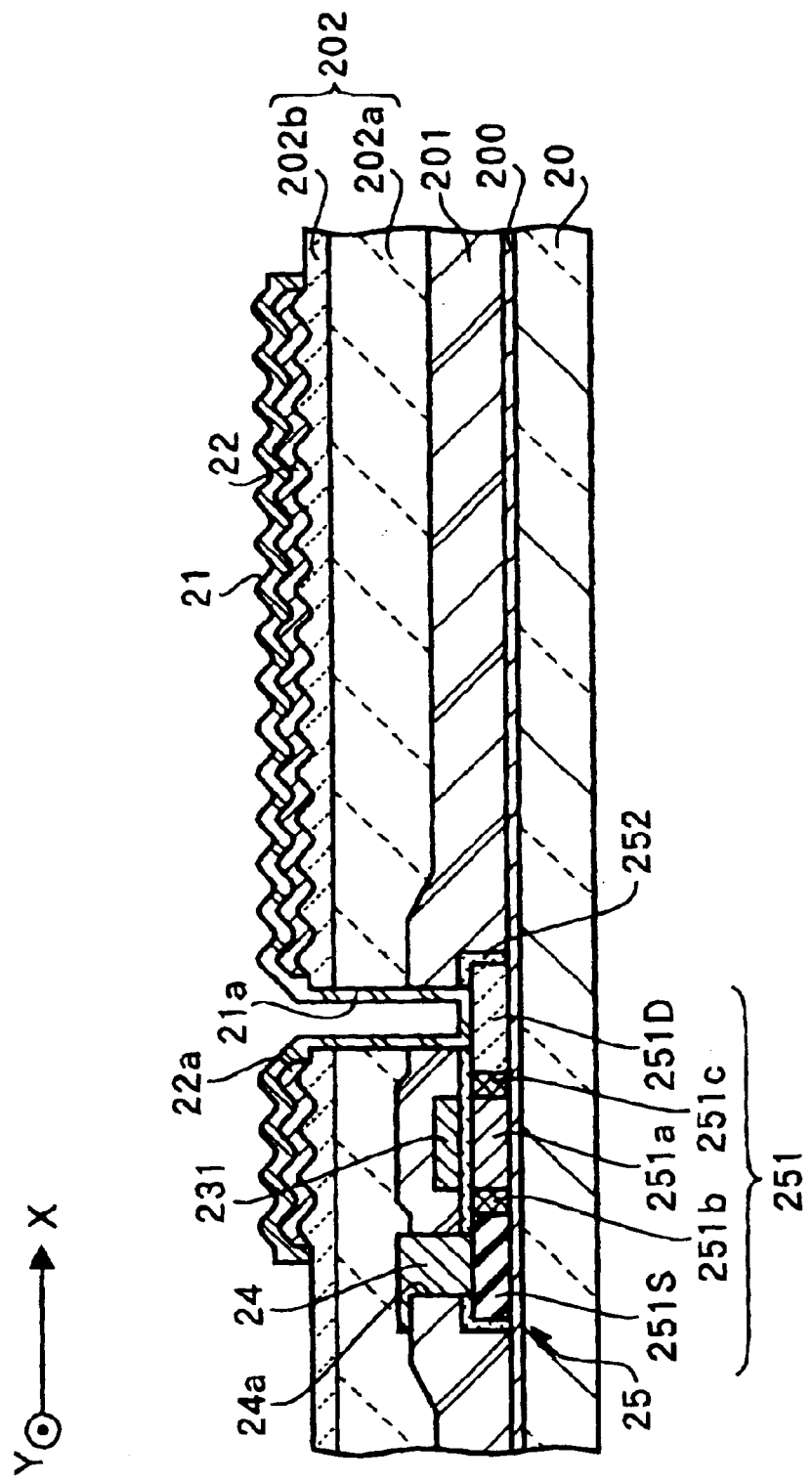
FIG. 4 is a sectional view showing the cross-sectional structure of the section indicated by line B–B' shown in FIG. 3 in the neighborhood of a TFT as a switching element.

The positional relationship among the aforementioned elements formed on the second substrate 20 will be described below in detail with reference to FIG. 4 which is a sectional view of the section indicated by line B–B' shown in FIG. 3. As shown in FIG. 4, on the inner surface of the second substrate 20, a semiconductor layer 251 is formed on a substrate insulation film 200 made of silicon oxide ($SiO_2$), etc., which serves as a substrate. The surface of this semiconductor layer 251 is covered with an insulation film 252 produced by applying a thermal oxidation treatment to the semiconductor layer 251. In this semiconductor layer 251, the region overlapping the aforementioned scanning line 23 becomes a channel region 251a.

That is, as shown in FIG. 3, each scanning line 23 includes a portion which is branched from the portion extending in the direction of the X axis toward the direction of the Y axis so as to intersect the semiconductor layer 251, and this intersection portion functions as a gate electrode 231. On the other hand, the surface of the substrate insulation film 200, on which the semiconductor layer 251 and the gate electrode 231 (therefore, the scanning line 23) have been formed, is covered with a first interlayer insulation film 201 made of, for example, silicon oxide ($SiO_2$), etc.

In the semiconductor layer 251, a low concentration source region 251b and a high concentration source region 251S are placed on the source side of the channel region 251a, while a low concentration drain region 251c and a high concentration drain region 251D are placed on the drain side of the channel region 251a and, therefore, a so-called LDD (Lightly Doped Drain) structure is made. Among them, the high concentration source region 251S is connected to the aforementioned data line 24 through a contact hole 24a which opens the insulation film 252 and the first interlayer insulation film 201 on the surface of the semiconductor layer 251.

The surface of the first interlayer insulation film 201, on which the data line 24 is formed, is covered with a second interlayer insulation film 202. This second interlayer insulation film 202 includes a silicon nitride (SiN) layer 202a and a resin layer 202b which is a resin material of, for example, acryl-based or epoxy-based, laminated on the surface of the aforementioned silicon nitride layer 202a. The aforementioned pixel electrode 21 and reflection layer 22 are formed on the surface of this second interlayer insulation film 202. More specifically, an opening portion 22a is placed in the reflection layer 22, and the pixel electrode 21 formed covering the reflection layer 22 is connected to the high concentration drain region 251D of the semiconductor layer 251 through this opening portion 22a and the contact hole 21a formed in the second interlayer insulation film 202.

As shown in FIG. 4, the surface of the resin layer 202b constituting the second interlayer insulation film 202 is a roughened surface on which numbers of fine crest portions (that is, portions protruded in the shape of a convexity) and trough portions (that is, portions dented in the shape of a concavity) are formed. Consequently, crest portions and trough portions incorporated with the roughened surface (that is, scattering structure) are formed on the surface of the thin film-shaped reflection layer 22 formed on the resin layer 202b. As a result of formation of this scattering structure, the incident light from the first substrate 10 side is emitted from the first substrate 10 side in the condition of being scattered moderately at the surface of the reflection layer 22 and, therefore, a wide viewing angle can be ensured.

Figure 7:
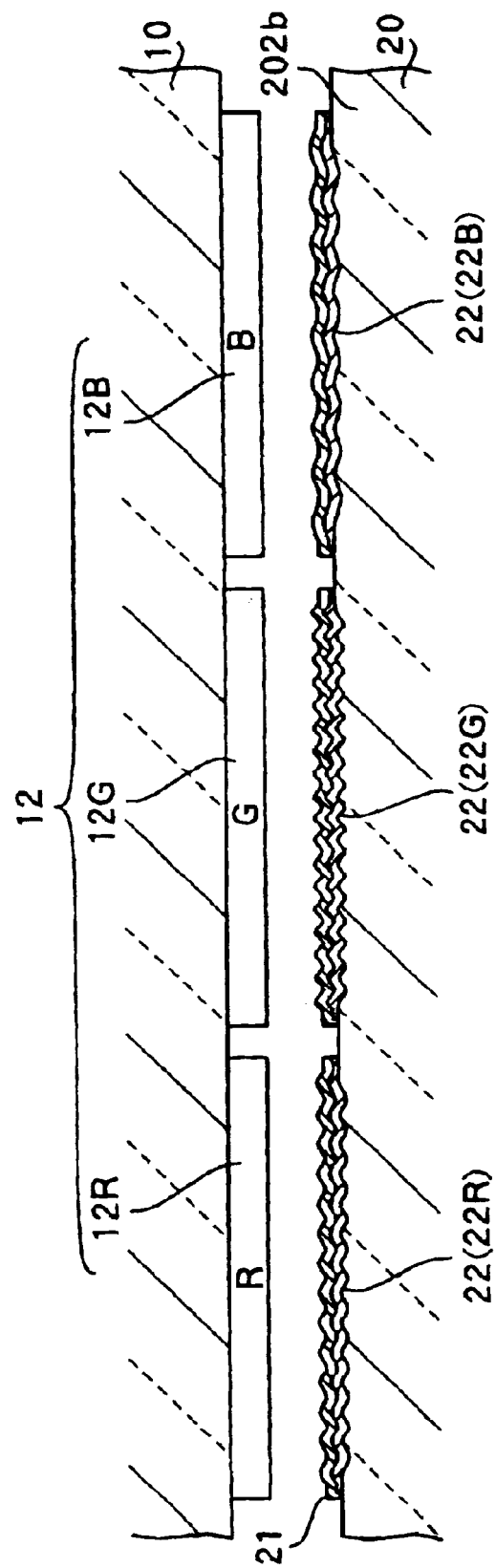
FIG. 7 is a sectional view of the section indicated by line C–C' in FIG. 3 showing the configuration of the key portion in the case where the first mode is adopted as the surface shape of the reflection layer.
Figure 8:
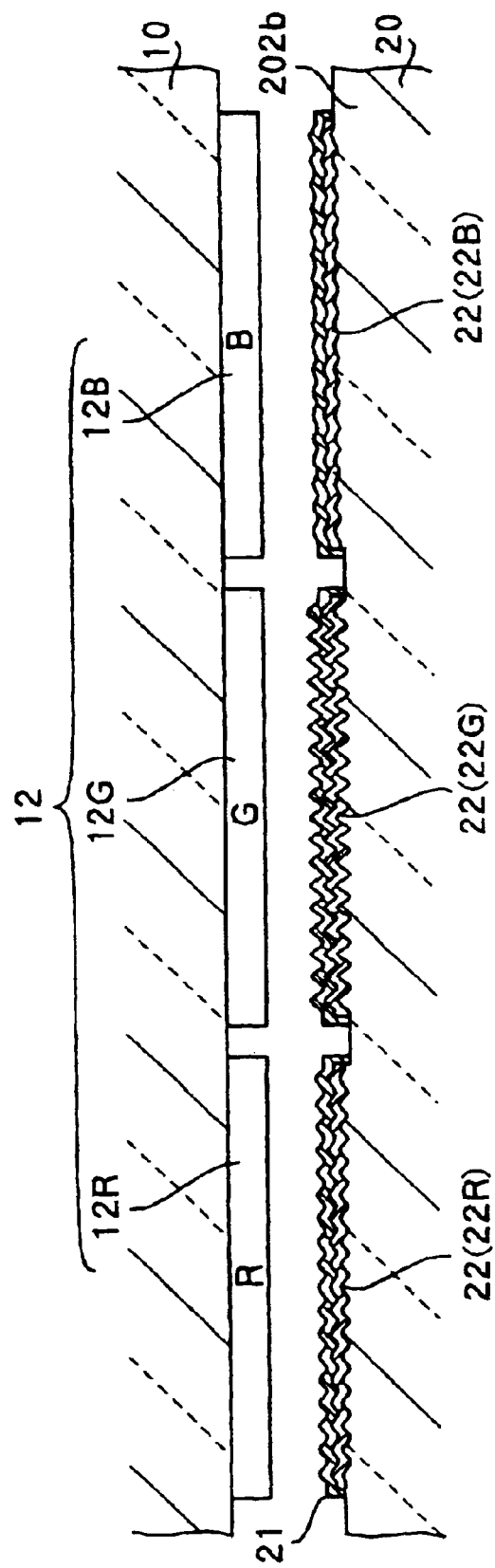
FIG. 8 is a sectional view of the section indicated by line C–C' in FIG. 3 showing the configuration of the key portion in the case where the second mode is adopted as the surface shape of the reflection layer.

However, in the present embodiment, the surface shapes of the reflection layers 22 (that is, the surface shape of the resin layer 202b) facing the color filters 12 of respective colors are varied in accordance with the color of the color filter facing the reflection layer 22 (refer to FIG. 7 and FIG. 8). Hereafter, the reflection layer 22 facing the color filter 12R, 12G, or 12B having red-based, green-based, or blue-based colors, respectively, may be represented by "reflection layer 22R", "reflection layer 22G", or "reflection layer 22B", respectively.

Figure 5:
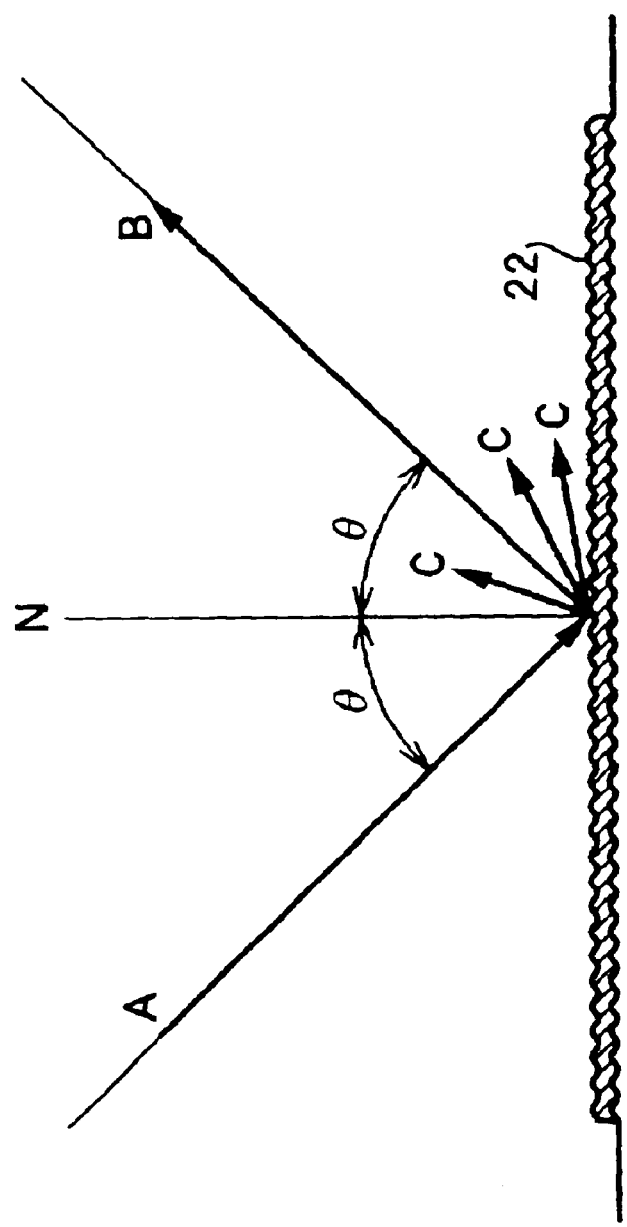
FIG. 5 is a diagram for explaining the mirror reflectivity.

For further details, the surface shape of each reflection layer 22 is selected in order that when the same light is radiated, the mirror reflectivities R are varied with respect to each reflection layer 22 facing the color filter of each color. Herein, in the present specification, "mirror reflectivity R" refers to a value (%) indicating the ratio of the quantity B of light mirror-reflected at the surface of the reflection layer 22 to the quantity A of light radiated on the reflection layer 22, as shown in FIG. 5. That is, the mirror reflectivity R is represented by ((mirror reflection light quantity B)/(radiation light quantity A))×100(%).

In the present specification, "mirror reflection light" refers to the light emitted at an angle equivalent to the angle θ with respect to the normal among the light reflected at the surface of the reflection layer 22 (that is, except the light scattered at the reflection layer 22 surface and emitted at an angle other than θ) when the light is made to enter the reflection layer 22 at the angle (incident angle) θ with respect to the normal.

Therefore, the fact that the mirror reflectivity R is high means relatively that the mirror reflection light quantity B is large and the light quantity C scattered (that is, irregularly reflected) at the reflection layer 22 surface is small. Conversely, the fact that the mirror reflectivity R is low means that the mirror reflection light quantity B is small and the light quantity C scattered at the reflection layer 22 surface is large. When the surface of the reflection layer 22 is a perfect mirror surface, the mirror reflectivity becomes about 100%.

In the present embodiment, by varying the mirror reflectivity R of the reflection layer 22 facing the color filter 12 of each color in accordance with the spectral luminous efficacy of the light of each color, the difference in the spectral luminous efficacy is compensated. For example, since the spectral luminous efficacy of the blue-based light is lower than the spectral luminous efficacy of the green-based light, the mirror reflectivity R of the reflection layer 22B facing the blue-based color filter 12 is set to be higher than the mirror reflectivity R of the reflection layer 22G facing the green-based color filter 12.

According to this, in the reflection layer 22B, the light quantity scattered at the surface thereof can be suppressed and the mirror reflection light quantity can be increased compared to that in the reflection layer 22G. Put another way, the light quantity reflected at the surface of the reflection layer 22B and visually identified by the observer can be made larger than the light quantity reflected at the surface of the reflection layer 22G and visually identified by the observer. Consequently, the difference in the spectral luminous efficacy can be compensated with respect to the light of both colors.

As is clear also from this, it is desirable to make the mirror reflectivity R of the reflection layer 22 facing the color filter 12 of the color having low spectral luminous efficacy (for example, blue base) higher than the mirror reflectivity R of the reflection layer 22 facing the color filter 12 of the color having high spectral luminous efficacy (for example, green base). However, generally, in many cases, the spectral luminous efficacy of the blue-based light is higher than the spectral luminous efficacy of the red-based light, and the spectral luminous efficacy of the red-based light is higher than the spectral luminous efficacy of the green-based light. Consequently, in the present embodiment, the surface shape of each reflection layer 22 is varied in order that the mirror reflectivity Rb of the reflection layer 22B facing the blue-based color filter, the mirror reflectivity Rr of the reflection layer 22R facing the red-based color filter, and the mirror reflectivity Rg of the reflection layer 22G facing the green-based color filter become 20%, 15%, and 10%, respectively, that is, Rb>Rr>Rg is held.

More specifically, the mirror reflectivities of the reflection layers 22 are varied in accordance with the difference in the shapes of the crest portions and the trough portions on each reflection layer 22 surface, that is, in accordance with the difference in the shapes of the crest portions and the trough portions formed on the surface of the resin layer. The relationship between the mirror reflectivity of the reflection layer 22 and the shape of the reflection layer 22 surface will be described below in detail.

Figure 6:
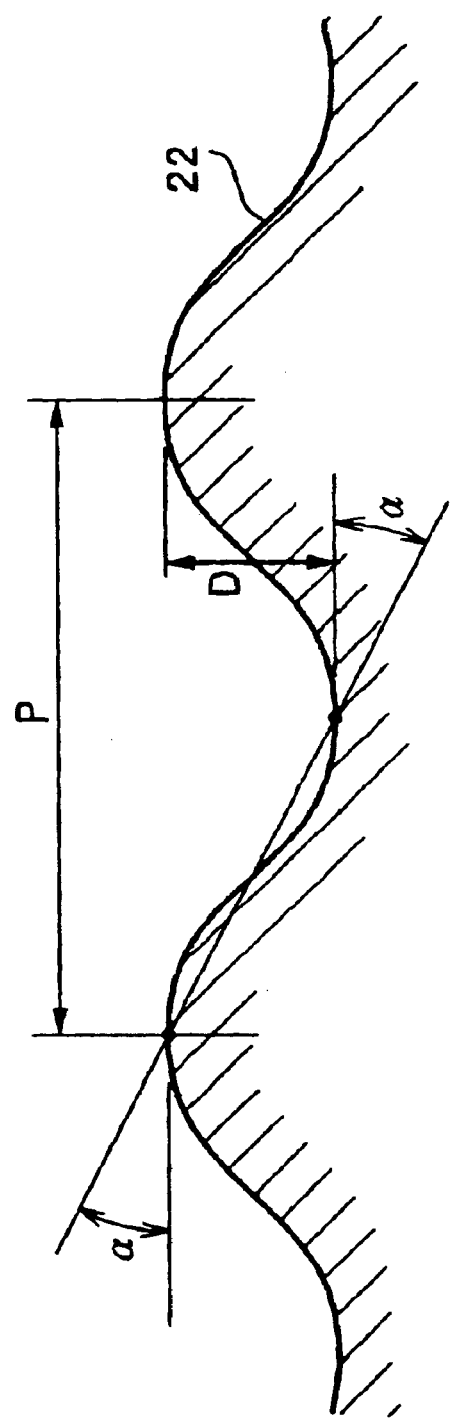
FIG. 6 is a diagram for explaining the pitch, depth, and inclination in order to specify the surface shape.

In the present embodiment, as distinctive values for identifying the surface shape of the reflection layer 22 surface, the pitch P of the crest portions, the depth D of the trough portion, and the inclination α are used. As shown in FIG. 6, the pitch P of the crest portions refers to the distance between the top of one of the crest portions formed on the surface of the reflection layer 22 and the top of the other crest portion adjacent to the crest portion, put another way, the distance between the bottom of one of the trough portions and the bottom of the other trough portion adjacent to the trough portion.

The depth D of the trough portion refers to the depth of the trough portion with respect to the plane nearly parallel to the substrate surface of the second substrate 20. In FIG. 6, the case where the surface including the top of the crest portion is taken as a reference surface, and the distance between this reference surface and the bottom of the trough portion is defined as the depth D of the trough portion is exemplified. In this case, the depth D of the trough portion is equivalent to the height of the crest portion when the surface including the bottom of the trough portion is taken as a reference surface.

The inclination α refers to an angle between the substrate surface of the second substrate 20 and the direction from the top of one of the crest portions toward the bottom of the trough portion adjacent thereto.

Since variations occur usually in the aforementioned distinctive values for the reason of manufacturing techniques, when those distinctive values are used, an average value of each distinctive value is determined with respect to each reflection layer 22 facing the color filter 12 of each color, and the average value thereof is used.

In FIG. 6, when the surface of the reflection layer 22 is made to have a shape in which the pitch P of the crest portions is large, and the depth D of the trough portion is small or the inclination α is small, the mirror reflectivity R of the reflection layer 22 can be made a large value. Conversely, when the surface of the reflection layer 22 is made to have a shape in which the pitch P of the crest portions is small, and the depth D of the trough portion is large or the inclination α is large, the mirror reflectivity R of the reflection layer 22 can be made a small value.

As described above, the mirror reflectivity R can be set arbitrarily on a reflection layer 22 basis by varying the values of the pitch P, depth D, and inclination α with respect to each reflection layer 22 facing the color filter 12 of each color. In the present embodiment, by adopting a first mode or a second mode described below as the surface shape of the reflection layer 22 (that is, the surface shape of the resin layer 202b shown in FIG. 4), the mirror reflectivities of the reflection layer 22B, 22R, and 22G shown in FIG. 3 are set at 20%, 15%, and 10%, respectively.

[1] First Mode

FIG. 7 is a sectional view showing the condition of the surface of the reflection layer 22 in the case where the first mode is adopted as the surface shape of the reflection layer 22. FIG. 7 corresponds to the sectional view of the section indicated by line C–C' shown in FIG. 3. However, in FIG. 7, only the pixel electrodes 21, reflection layers 22, and the resin layer 202b among the elements on the second substrate 20 are shown in the drawing, and only the color filter 12 among the elements on the first substrate 10 is shown in the drawing.

In FIG. 7, the depths D of the trough portions are set at nearly the same over the reflection layers 22 facing the color filters 12 of respective colors. On the other hand, the average values of the pitches P are made to vary with respect to each reflection layer 22 facing the color filter 12 of each color.

More specifically, the depths D of the trough portions are set at 0.6 μm over the reflection layers 22 facing the color filters 12 of respective colors. That is, the depths D of the trough portions are set at nearly constant value over all reflection layers 22. On the other hand, regarding the reflection layer 22B, the average value of the pitches P of the crest portion is set at 12 μm, regarding the reflection layer 22R, the average value of the pitches P of the crest portion is set at 8.5 μm, and regarding the reflection layer 22G, the average value of the pitches P of the crest portion is set at 7 μm.

As described above, when the depths D of the trough portions are set at constant, the mirror reflectivity R increases with increase in the pitch P of the crest portions. Therefore, by making the surface of the reflection layer 22 have such a shape, the mirror reflectivities Rb, Rr, and Rg of the reflection layers 22 facing the blue-based, red-based, and green-based color filters 12 can be set at 20%, 15%, and 10%, respectively.

In this case, the inclinations α become 6° regarding the reflection layer 22 facing the blue-based color filter 12, become 8° regarding the reflection layer 22 facing the red-based color filter 12, and become 10° regarding the reflection layer 22 facing the green-based color filter 12.

[2] Second Mode

Then, FIG. 8 is a sectional view showing the condition of the surface of the reflection layer 22 in the case where the second mode is adopted as the surface shape of the reflection layer 22. In FIG. 8, the pitches P of the crest portions are set at nearly the same over the reflection layers 22 facing the color filters 12 of respective colors. On the other hand, the average values of the depths D of the trough portions are made to vary with respect to each reflection layer 22 facing the color filter 12 of each color.

More specifically, the pitches P of the crest portions are set at 12 μm over the reflection layers 22 facing the color filters 12 of respective colors. That is, the pitches P of the crest portions are set at nearly constant value over all reflection layers 22.

On the other hand, regarding the reflection layer 22 facing the blue-based color filter 12, the average value of the depth D is set at 0.6 μm, regarding the reflection layer 22 facing the red-based color filter 12, the average value of the depths D is set at 0.8 μm, and regarding the reflection layer 22 facing the green-based color filter 12, the average value of the depths D is set at 1.0 μm.

As described above, when the pitches P of the crest portions are set at constant, the mirror reflectivity R increases with decrease in the depth D of the trough portion. Therefore, by making the surface of the reflection layer 22 have such a shape, the mirror reflectivities Rb, Rr, and Rg of the reflection layers 22 facing the blue-based, red-based, and green-based color filters 12 can be set at 20%, 15%, and 10%, respectively. In this case, the inclinations α become values similar to those in the aforementioned first mode.

As described above, in the present embodiment, the mirror reflectivities R vary with respect to each reflection layer 22 facing the color filter 12 of each color. Therefore, regarding the reflection layer 22 facing the blue-based color filter 12, the light quantity scattered at the surface thereof can be suppressed and the mirror reflection light quantity can be increased compared to the reflection layer 22 facing the green-based color filter 12.

Put another way, the light quantity reflected at the surface of the reflection layer 22 facing the blue-based color filter 12 and visually identified by the observer can be made larger than the light quantity reflected at the surface of the reflection layer 22 facing the green-based color filter 12 and visually identified by the observer. Consequently, through the use of the liquid crystal display device according to the present embodiment, that is, the electro-optic device, difference in the spectral luminous efficacy with respect to the light having each wavelength within the visible-light region can be compensated and, therefore, the color balance of the color image visually identified by the observer can be kept excellent.

Next, a manufacturing process for the liquid crystal display device according to the present embodiment, that is, the electro-optic device, especially the manufacturing process for each element on the second substrate 20 will be described. A manufacturing process in the case where the first mode is adopted as the surface shape of the reflection layer 22, that is, in the case where the pitches P of the crest portions are varied with respect to each reflection layer 22 facing the color filter 12 of each color, and a manufacturing process in the case where the second mode is adopted, that is, the depths D of the trough portions are varied with respect to each reflection layer 22 facing the color filter 12 of each color, will be described below separately.

(Manufacturing Process in the Case Where the First Mode is Adopted)

Figure 9:
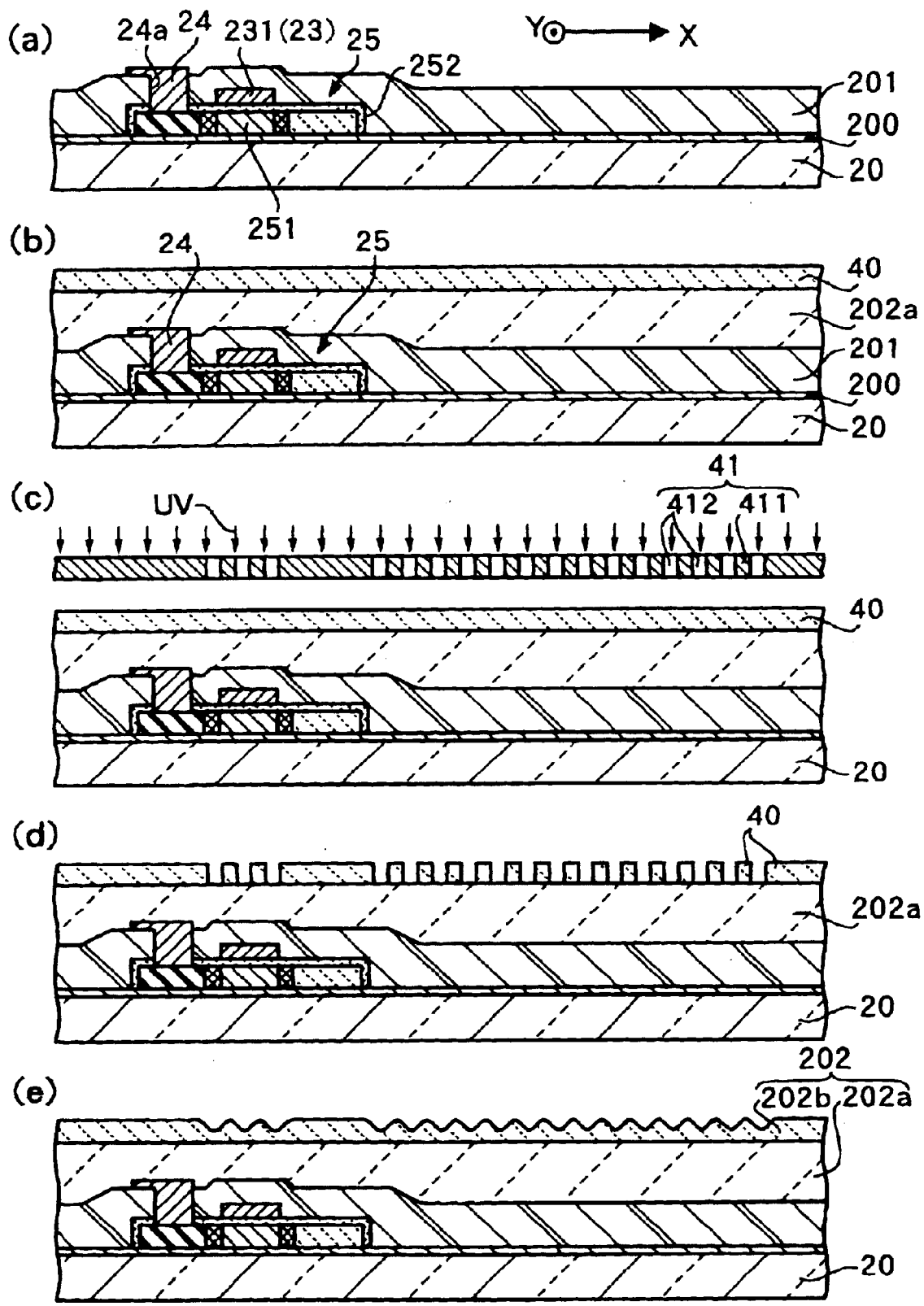
FIG. 9 is a diagram showing an embodiment of a manufacturing method for the liquid crystal display device shown in FIG. 1 by using sectional views of the liquid crystal display device in order of performance.

In FIG. 9(a), a semiconductor layer 251 made of polysilicon is formed on the surface of a second substrate 20 covered with a substrate insulation film 200 and, in addition, a thermal oxidation treatment is applied so as to form an insulation film 252 on the surface of the semiconductor layer 251.

A polysilicon layer is deposited on the surface of the insulation film 252 and over the surface of the second substrate 20. Thereafter, the polysilicon layer is patterned by photolithography or etching and, therefore, a scanning line 23 including a portion extending in the direction of the X axis and a branch portion corresponding to a gate electrode 231 of a TFT 25 is formed. The scanning line 23 may be formed from an aluminum or other metal film, or metal silicide film instead of polysilicon.

The semiconductor layer 251 is doped with a proper impurity and, therefore, the aforementioned LDD structure is formed. A first interlayer insulation film 201 made of silicon oxide, etc., is formed in order to cover the surface of the second substrate 20, on which the semiconductor layer 251 and the scanning line 23 have been formed and, in addition, a contact hole 24a is formed through the first interlayer insulation film 201 and the insulation film 252. A conductive film made of low-resistance metal, for example, aluminum, is deposited in order to cover each of these portions. Thereafter, the conductive film is patterned by photolithography, etching, or the like and, therefore, a data line 24 is formed.

Through the aforementioned steps, as shown in FIG. 9(a), the scanning line 23 and the gate electrode 231 extending in the direction of the X axis, the data line 24 extending in the direction of the Y axis, and the TFT 25 corresponding to the intersection thereof are formed on the surface of the second substrate 20.

In FIG. 9(b), a silicon nitride layer 202a is formed in order to cover the first interlayer insulation film 201 on which the data line 24 has been formed. The surface of the silicon nitride layer 202a is coated with a positive type photosensitive resin, and pre-baking is performed so as to form a resin layer 40.

Subsequently, as shown in FIG. 9(c), the resin layer 40 is radiated with ultraviolet (UV) through a photomask 41. This photomask 41 is provided with base members 411 having a light-shielding property and, in addition, includes light transmission portions 412 corresponding to the portions, at which trough portions are to be formed, on the resin layer 40.

By performing the step shown in FIG. 9(c) using this photomask 41, in the resin layer 40, the portions radiated with the ultraviolet passed through the aforementioned light transmission portions 412, that is, the portions to become trough portions undergo photoreaction. Consequently, when a developing treatment is performed thereafter, the resin layer 40 is selectively removed while the portions to become crest portions are left, as shown in FIG. 9(d).

The resin layer 40 thus produced is heated to the heat distortion temperature or more of the resin layer 40 (for example, 150° C. or more). The resin layer 40 is softened by this heating, and the corner portions are rounded by the heat distortion. As a result, as shown in FIG. 9(e), a resin layer 202b, in which the surface has become a roughened surface having smooth asperities, is formed on the surface of the silicon nitride layer 202a.

A metal film made of a metal having a light-reflecting property, for example, aluminum, is deposited by sputtering, etc., on the roughened surface of the resin layer 202b. Subsequently, as shown in FIG. 10(a), this metal film is patterned and, therefore, a reflection layer 22 is formed. During this patterning, an opening portion 22a to bring the pixel electrode 21 and the low concentration drain region 251D into conduction in the reflection layer 22 is also formed. On the surface of the reflection layer 22 thus formed, as shown in FIG. 10(a), crest portions and trough portions incorporated with the crest portions and trough portions on the surface of the resin layer 202b are formed.

As shown in FIG. 10(b), the second interlayer insulation film 202, that is, the silicon nitride layer 202a and the resin layer 202b, is formed and, furthermore, a contact hole 21a is formed through the first interlayer insulation film 201 and the insulation film 252. Subsequently, a transparent conductive film made of ITO, etc., is formed on the surface of the second substrate 20 and, in addition, this transparent conductive film is patterned by photolithograph, etching, or the like so as to form the pixel electrode 21 covering the reflection layer 22 as shown in FIG. 10(c).

Subsequently, an orientation film 26 made of polyimide, etc., is formed in order to cover the second interlayer insulation film 202, on which the pixel electrode 21 and the reflection layer 22 have been formed, and, in addition, a rubbing treatment is applied to this orientation film 26. Each element on the second substrate 20 is formed by the aforementioned steps.

Among the aforementioned each step, a treatment for roughening the surface of the resin layer 40 will be described in detail. As shown in FIG. 9(c), in the step selectively removing the regions other than the regions to become the crest portions (that is, the regions to become the trough portions) in the resin layer 40, the resin layer 40 is radiated with ultraviolet through the photomask 41 including the light transmission portion 412 and the light shield portion 411.

Figure 11:
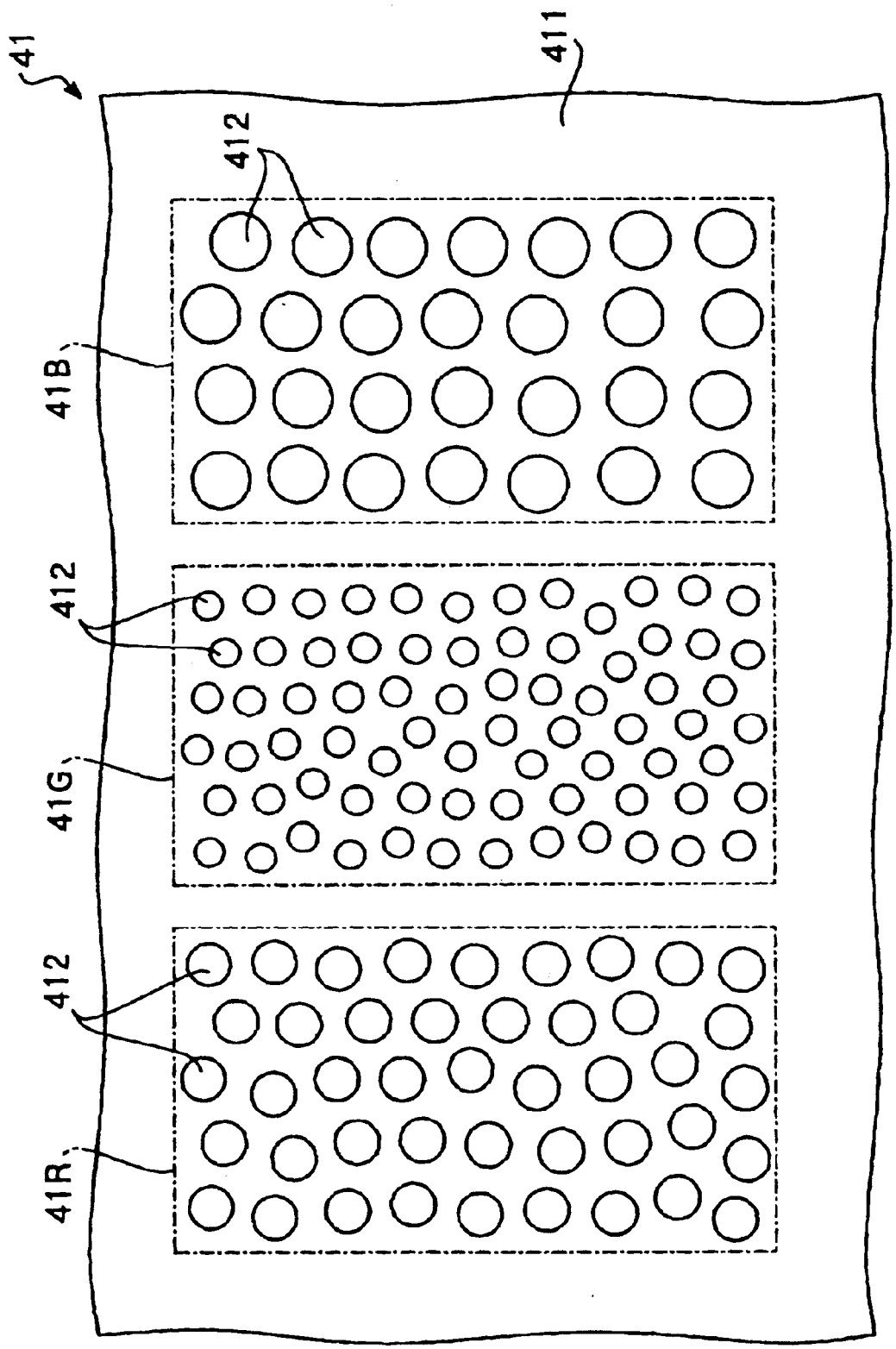
FIG. 11 is a plan view showing the configuration of a photomask used in a manufacturing process in the case where the first mode is adopted as the surface shape of the reflection layer.

Herein, FIG. 11 is a plan view schematically showing the configuration of this photomask 41. However, in FIG. 11, only a part of the photomask 41 placed in order to cover the whole surface of the second substrate 20 is shown in the drawing. That is, a region 41R of the photomask 41 shown in FIG. 11 is a portion for covering the region, on which the reflection layer 22R is to be formed, (that is, the portion for covering the region to face the red-based color filter 12 in the second substrate 20) in the resin layer 40 (therefore, resin layer 202b). A region 41G is a portion for covering the region, on which the reflection layer 220 is to be formed. A region 41B is a portion for covering the region, on which the reflection layer 22B is to be formed.

In FIG. 11, the photomask 41 is the base member 411 having a light-shielding property, on which a plurality of circular or polygonal light transmission portions 412 are formed. In the resin layer 40, the portions radiated with ultraviolet passed through these light transmission portions 412 become trough portions. On the other hand, as described above, in the case where the surface shape of the reflection layer 22 is made to be the first mode (that is, in the case where the pitches P are varied with respect to each reflection layer 22 facing the color filter 12 of each color), the pitches P on the surface of the resin layer 202b must be varied with respect to each region facing the color filter 12 of each color.

Consequently, as shown in FIG. 11, the diameters of the light transmission portions 412 and the distances between the centers of adjacent light transmission portions 412 are varied in terms of average value with respect to each of the regions 41R, 41G, and 41B of the photomask 41. More specifically, the average value of the diameters of the light transmission portions 412 formed in the regions 41R, 41G, and 41B of the photomask 41 are 6 μm, 5 μm, and 8 μm, respectively. On the other hand, in the regions 41R, 41G, and 41B, the average values of the distances between the centers of adjacent light transmission portions 412 are 8.5 μm, 7 μm, and 12 μm, respectively.

That is, since the average value of the pitches P of the reflection layer 22 becomes nearly the same as the average value of the pitches P of the resin layer 202b, the average value of the distances between the centers of light transmission portions 412 in the photomask 41 is set to become nearly the same as the average value of the pitches P of the reflection layer 22.

As described above, by appropriately selecting the diameters and the interval of the light transmission portions 412 formed in the photomask 41, the pitch P of the crest portions and, therefore, the pitch P of the trough portions, in the resin layer 202b can be selected arbitrarily. Consequently, the pitches P on the surface of the reflection layer 22 can be selected arbitrarily with respect to each region facing the color filter 12 of each color.

Herein, the case where the resin layer 40 is formed from a positive type photosensitive resin is exemplified. However, in the case where the resin layer 40 is formed from a negative type photosensitive resin, ultraviolet radiation may be performed using the photomask 41 in which the relationship between the base member 411 and the light transmission portion 412 is reversed. That is, the photomask in this case is the one in which a plurality of circular or polygonal light shield portions are formed on the translucent base member.

Each element is formed on the second substrate 20 by the aforementioned steps as shown in FIG. 10(c), while regarding the first substrate 10 shown in FIG. 2, a light shield portion 11, a color filter 12, an overcoat layer 13, a counter electrode 14, and an orientation film 15 are formed on the first substrate 10. Then, this first substrate 10 and the second substrate 20 shown in FIG. 10(c) are adhered to each other with the seal member 31 (refer to FIG. 2) therebetween in order that the surfaces, on which electrodes have been formed, face each other.

In FIG. 2, the liquid crystal 32 is encapsulated in the region surrounded by both substrates and the seal member 31 through the opening portion (not shown in the drawing) of the seal member 31 and, thereafter, the opening portion is sealed with the seal member 311 (refer to FIG. 1). Subsequently, in FIG. 2, the polarizing plates 18, the phase difference plates 19, etc., are adhered on the substrate surfaces of both substrates 10 and 20 and, therefore, the liquid crystal display device shown in FIG. 1, that is, the electro-optic device, can be produced.

(Manufacturing process in the case where the second mode is adopted)

Next, the manufacturing process in the case where the second mode shown in FIG. 8 is adopted as the surface shape of the reflection layer 22, that is, the average values of the depths D of the trough portions are varied with respect to each reflection layer 22 facing the color filter 12 of each color and, in addition, the average values of the pitches P are set at nearly the same, will be described.

Through the steps shown in FIG. 9(a) similar to those in the case where the aforementioned first mode is adopted, the scanning line 23 extending in the direction of the X axis, the data line 24 extending in the direction of the Y axis, and the TFT 25 corresponding to the intersection thereof are formed on the surface of the second substrate 20. Thereafter, in FIG. 9(b), the silicon nitride layer 202a and the resin layer 40 are formed in order to cover the first interlayer insulation film 201 on which the data line 24 has been formed.

Subsequently, as shown in FIG. 12(a), in the region 40B to face the blue-based color filter 12 of the resin layer 40, the portions to become trough portions undergo photoreaction selectively by being radiated with ultraviolet through a photomask 42B. That is, this photomask 42B includes a light shield portion 423 for covering the region 40R to face the red-based color filter 12R of the resin layer 40 and the region 40G to face the green-based color filter 12G, and a light shield portion 424 for covering the regions to become crest portions in the region 40B.

Figure 12:
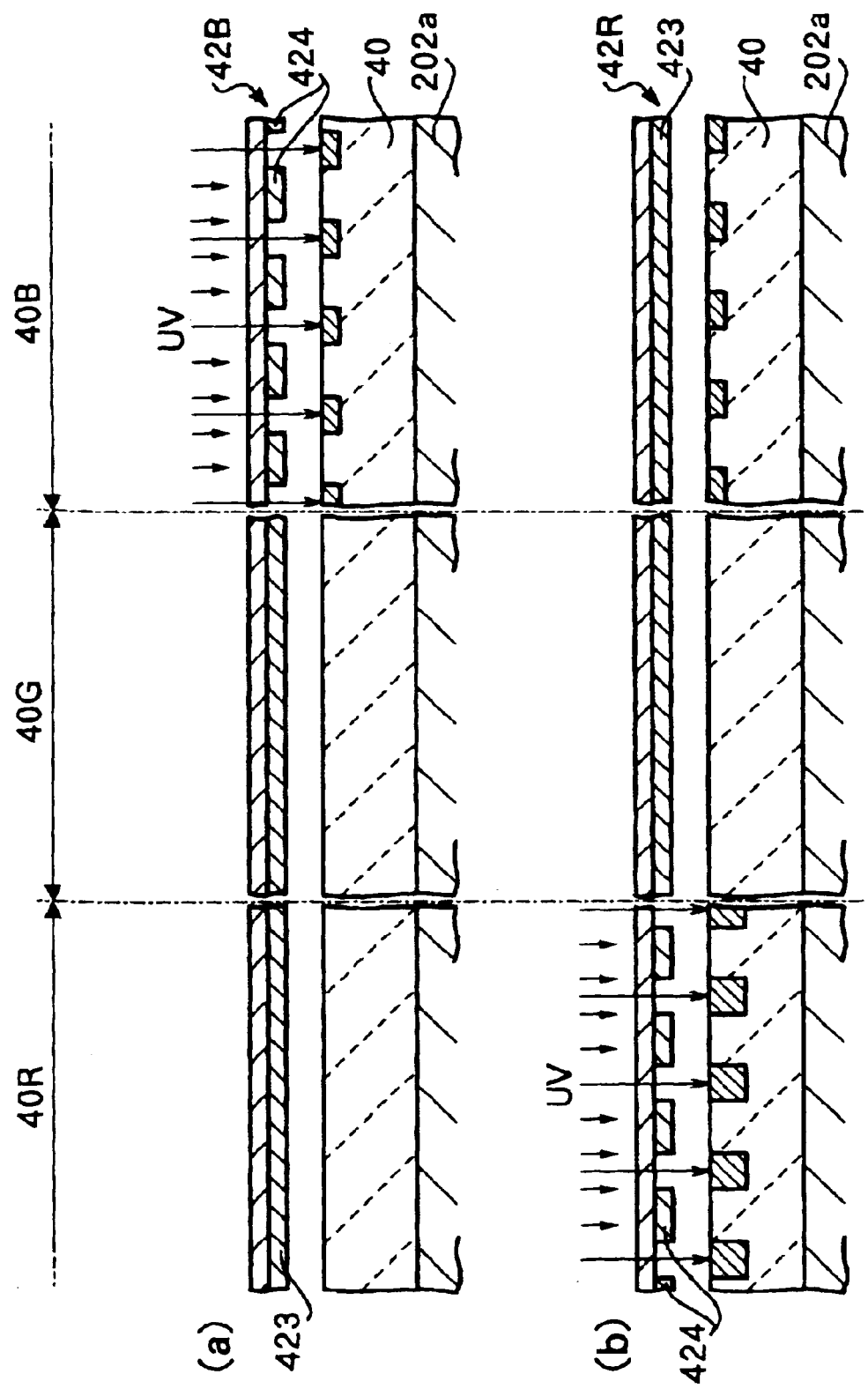
FIG. 12 is a sectional view showing a manufacturing process in the case where the second mode is adopted as the surface shape of the reflection layer.

By radiating the resin layer 40 with ultraviolet for a predetermined time through this photomask 42B, a predetermined thickness of the portions to become trough portions in the region 40B undergo photoreaction. In FIG. 12, the portions, which have undergone photoreaction by the ultraviolet radiation, of the resin layer 40 are diagonally shaded.

As shown in FIG. 12(b), the region 40R to face the red-based color filter 12 of the resin layer 40 undergoes photoreaction selectively. That is, the resin layer 40 is radiated with ultraviolet through a photomask 42R including a light shield portion 423 for covering the region 40B to face the blue-based color filter 12B of the resin layer 40 and the region 40G to face the green-based color filter 12G, and a light shield portion 424 for covering the regions to become crest portions in the region 40R.

The size and the interval of the light shield portion 424 in the photomask 42R are similar to those in the light shield portion 424 in the photomask 42B. However, the time for radiating the region 40R with ultraviolet is made longer than the time having been taken for radiating the aforementioned region 40B with ultraviolet. Consequently, as shown in FIG. 12(b), the portions to become trough portions in the region 40R of the resin layer 40 undergoes photoreaction until the deep portion compared to that in the portions to become trough portions in the region 40B.

Figure 13:
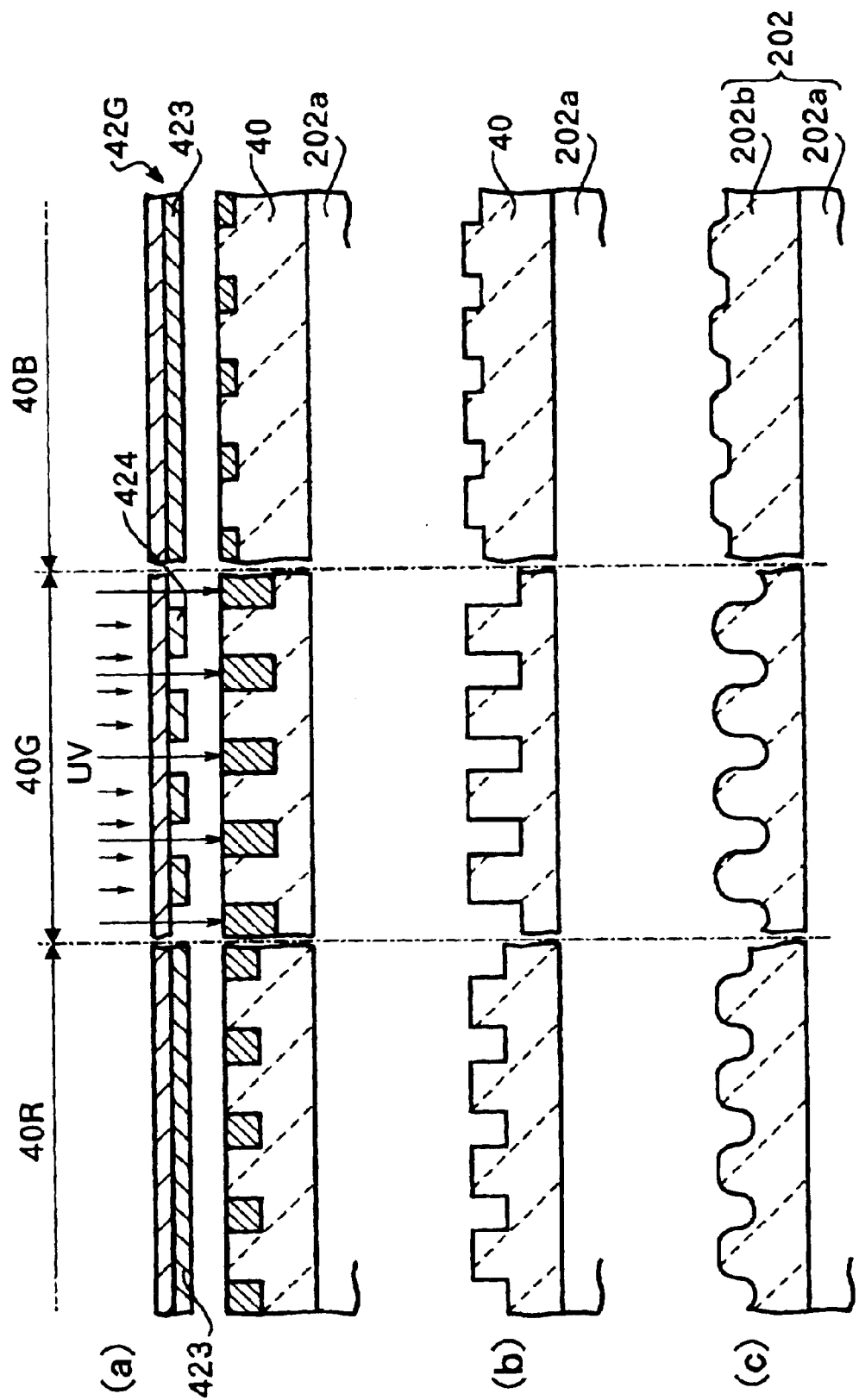
FIG. 13 is a sectional view showing steps on the back of the steps shown in FIG. 12.

Likewise, as shown in FIG. 13(a), regarding the region 40G to face the green-based color filter 12G of the resin layer 40, the portions to become trough portions are radiated with ultraviolet through a photomask 42G. However, the time for radiating the region 40G with ultraviolet is made longer than the time having been taken for radiating the region 40R with ultraviolet. Consequently, the portions to become trough portions in the region 40G of the resin layer 40 undergoes photoreaction until the deep portion compared to those in the portions to become trough portions in the region 40B and 40R.

Subsequently, by applying a developing treatment to the resin layer 40, the portions having undergone photoreaction by ultraviolet radiation are removed from all of the regions 40R, 40G, and 40B by one operation. As described above, in the regions to become trough portions of the resin layer 40, the depths of the portion having undergone photoreaction by ultraviolet radiation are different among the regions 40R, 40G, and 40B and, therefore, as the result of development, asperities, in which the depths vary on a region basis, are formed as shown in FIG. 13(b).

Thereafter, the resin layer 40 is softened by being heated to the heat distortion temperature or more and, therefore, the corner portions of the aforementioned asperities are rounded. As a result, as shown in FIG. 13(c), a resin layer 202b, which has smooth asperities and in which the depths D of the trough portions vary with respect to each region to face each of the color filters 12R, 12G, and 12B of respective colors, is formed on the silicon nitride layer 202a.

As described above, the depths D of the trough portions in each region to face the color filter 12 of each color are appropriately adjusted in accordance with the time for radiating each region with ultraviolet. Although ultraviolet radiation to the resin layer 40 has been performed in order of the region 40B, region 40R, and region 40G in the aforementioned example, this order is not limited to this. It is essential that the time for ultraviolet radiation is varied on a region basis in accordance with desired depths of the trough portions.

Subsequently, a reflection layer 22 and a pixel electrode 21 are formed by the steps shown in FIG. 10(a) to FIG.

10(C). In addition, an orientation film 26 (refer to FIG. 2) is formed in order to cover the resin layer 202b, on which these have been formed, and, furthermore, a rubbing treatment is applied to this orientation film 26. Then, the second substrate 20 and the first substrate 10 are adhered to each other in order that the electrode-facing surfaces face each other and, in addition, a liquid crystal is encapsulated between both substrates. Consequently, the liquid crystal display device 1 shown in FIG. 1, that is, the electro-optic device, can be produced.

(Second Embodiment)

Next, the second embodiment relating to the case where the present invention is applied to a liquid crystal display device, which is an example of electro-optic devices, will be described. This liquid crystal display device is a reflective liquid crystal display device of active matrix system provided with a TFD (Thin Film Diode) as a nonlinear element. Hereafter, regarding components of the liquid crystal display device according to the present embodiment, common components with the liquid crystal display device 1 shown in FIG. 1 are indicated by using the same reference numerals.

Figure 14:
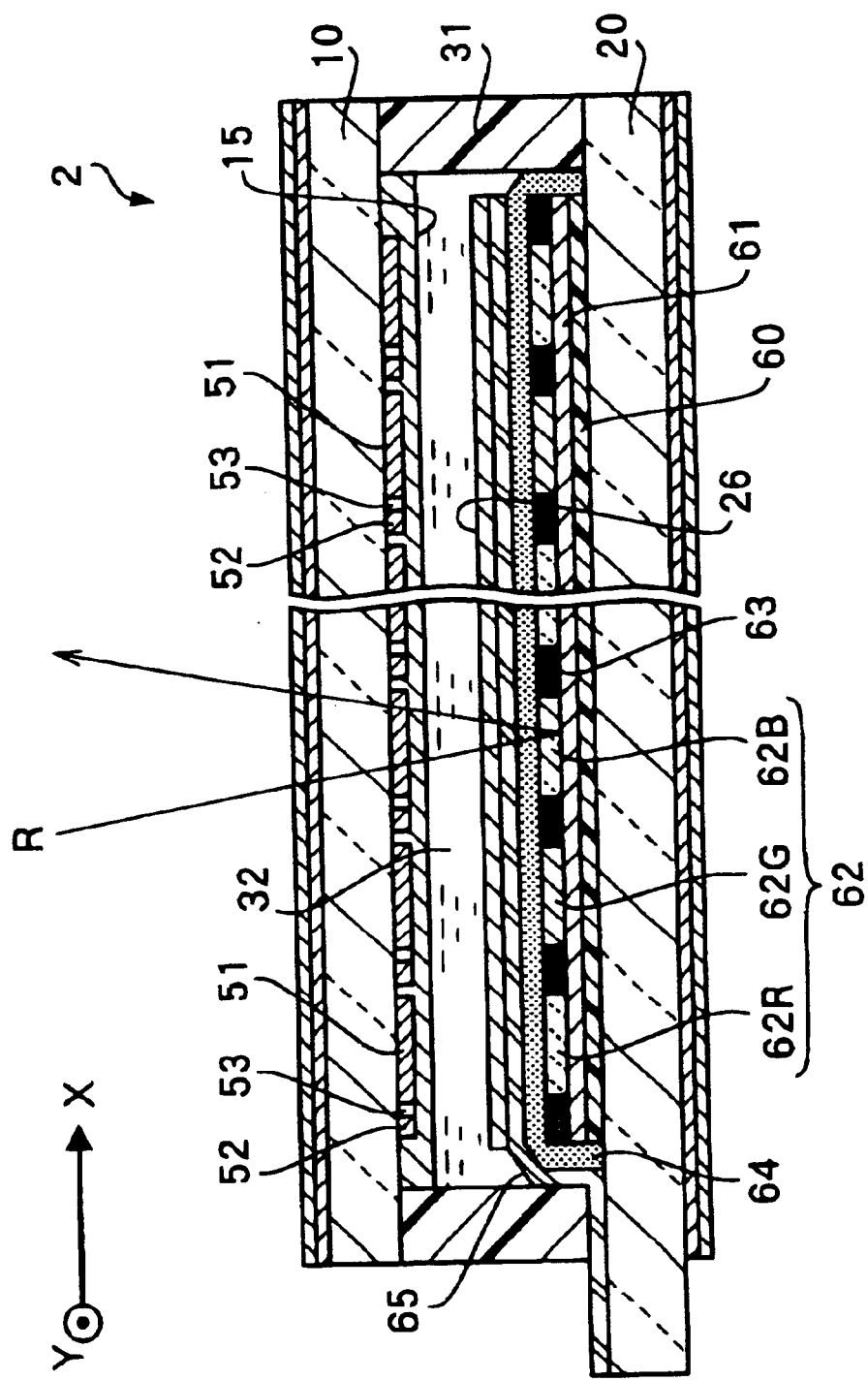
FIG. 14 is a perspective view showing another embodiment in the case where the present invention is applied to a liquid crystal display device which is an example of the electro-optic device according to the present invention.
Figure 15:
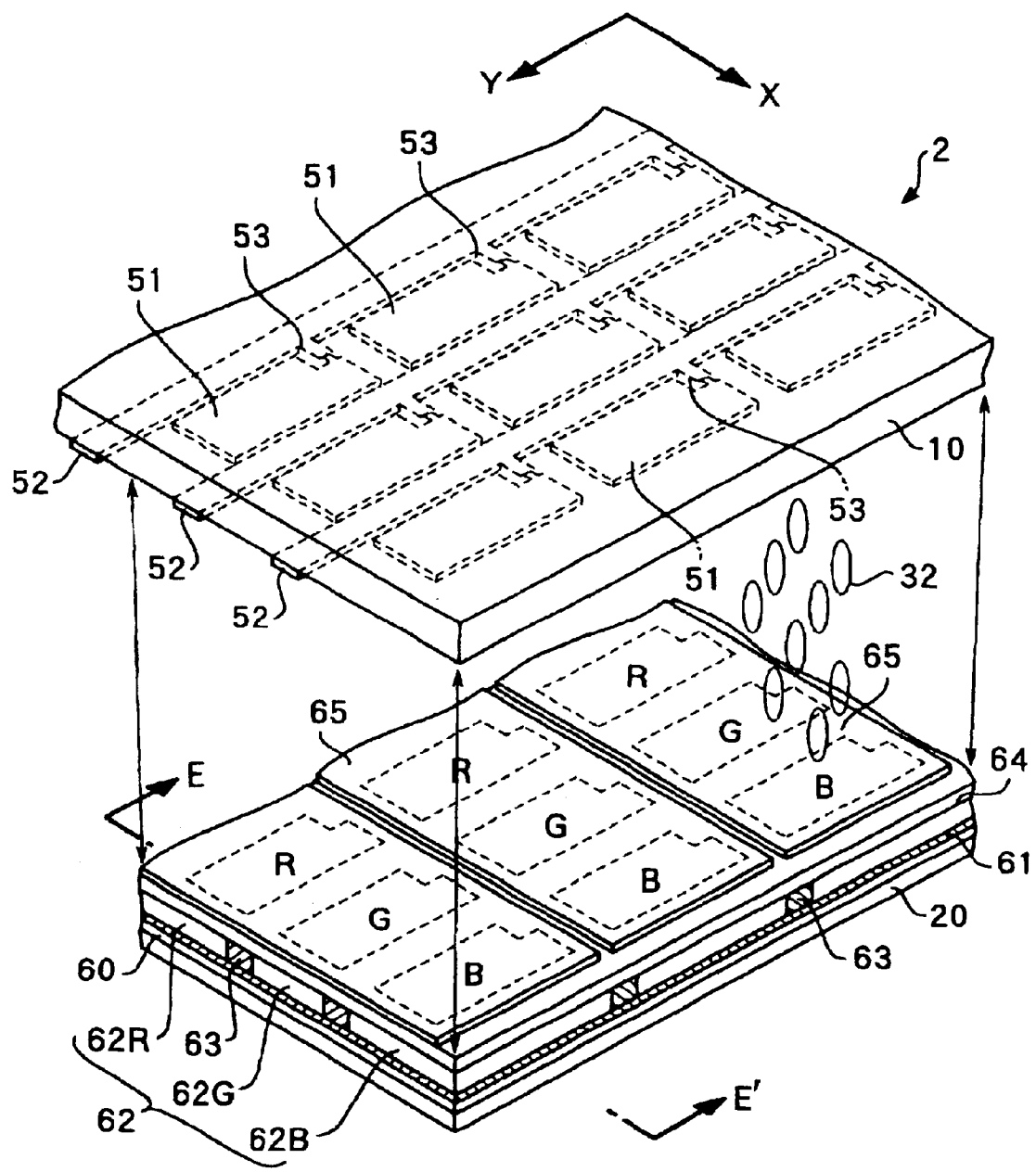
FIG. 15 is a perspective view showing the configuration of the key portion of the liquid crystal display device shown in FIG. 14.

FIG. 14 is a sectional view showing the configuration of a liquid crystal display device according to the present embodiment, and FIG. 15 is a perspective view showing the key portion of the liquid crystal display device. FIG. 14 corresponds to a sectional view of the section indicated by line E–E' in FIG. 15. As shown in these drawings, on the inner surface of a first substrate 10 in a liquid crystal display device 2, a plurality of pixel electrodes 51 arranged in the shape of a matrix, and a plurality of scanning lines 52 extending in the direction of the Y axis (that is, the direction perpendicular to the paper surface in FIG. 14) in the gap portions between each pixel electrode 51 are formed.

Furthermore, the pixel electrode 51 and the scanning line 52 adjacent to the pixel electrode 51 are connected with a TFD 53 therebetween. Each TFD 53 is a two-terminal type nonlinear element having a nonlinear current-voltage characteristic. The surface of the first substrate 10, on which the pixel electrodes 51, the scanning lines 52, and TFDs 53 are formed, is covered with an orientation film 15.

On the other hand, on the inner surface of a second substrate 20, a resin layer 60, a reflection layer 61, a color filter 62, a light shield layer 63, and an overcoat layer 64 covering the surface of the second substrate 20, on which these have been formed, are formed. The color filter 62 is formed by two-dimensionally arranging a color filter 62R colored in red base, a color filter 62G colored in green base, and a color filter 62B colored in blue base into a predetermined array pattern.

On the surface of the overcoat layer 64, a plurality of data lines 65 extending in the direction of the X axis (that is, the direction intersecting the scanning line 52) are formed. As shown in FIG. 14 and FIG. 15, each data line 65 is a band electrode formed from a transparent material, for example, ITO, and faces a plurality of pixel electrodes 51 arranged in a row in the direction of the X axis on the first substrate 10. Under this configuration, the orientation direction of the liquid crystal 32 held between the both electrodes varies due to application of the voltage between the pixel electrode 51 and the data line 65.

On the other hand, the reflection layer 61 is a thin film formed on the surface of the resin layer 60 covering the second substrate 20, and serves a function of reflecting the incident light R from the first substrate 10 side in FIG. 14. Each of the color filters 62 is placed on the surface of the reflection layer 61 in order to face the pixel electrode 51 on the first substrate 10.

Herein, the surface of the resin layer 60 becomes a roughened surface, on which numbers of fine crest portions and trough portions are formed, in a manner similar to that in the resin layer 202b shown in FIG. 4 in the aforementioned first embodiment. Therefore, on the surface of the reflection layer 61 shown in FIG. 14 formed on this roughened surface, crest portions and trough portions incorporated with the roughened surface are formed. In a manner similar to that in the aforementioned first embodiment shown in FIG. 2, in the liquid crystal display device 2 according to the present embodiment as well, the surface shapes of the resin layer 60 vary in order that the surface shapes vary with respect to each region facing the color filter of each color in the reflection layer 61. That is, pitch P of the crest portions, depth D of the trough portion, and the inclination α on the surface of the resin layer 60 are varied in order that the mirror reflectivity Rb, Rr, and Rg in the regions facing each of the blue-based, red-based, and green-based color filters in the reflection layer 61 become 20%, 15%, and 10%, respectively.

Figure 16:
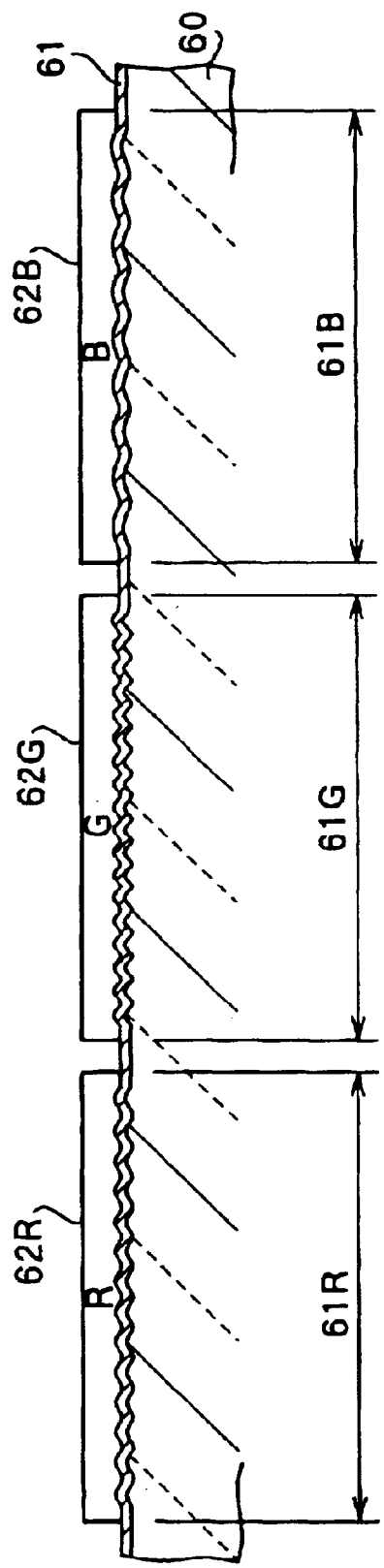
FIG. 16 is a sectional view showing the configuration of the key portion in the case where the first mode is adopted as the surface shape of the reflection layer.

FIG. 16 is a sectional view showing the reflection layer 61 together with the color filter 62 formed on the surface thereof in the case where the aforementioned first mode is adopted as the surface shape of the reflection layer 61. As shown in the aforementioned drawing, regarding this reflection layer 61, the depths D are nearly the same, for example, on the order of 0.6 μm, over the regions facing the color filters 62R, 62G, and 62B of respective colors. On the other hand, the average value of the pitches P of the crest portions vary with respect to each region facing each of the color filters 62R, 62G, and 62B of respective colors.

More specifically, in the reflection layer 61, the average value of the pitches P of the crest portions in the region 61B facing the blue-based color filter 62B is set at 12 μm, the average value of the pitches P in the region 61R facing the red-based color filter 62R is set at 8.5 μm, and the average value of the pitches P in the region 61G facing the green-based color filter 62G is set at 7 μm and, therefore, the mirror reflectivities Rb, Rr, and Rg in respective regions can be set at 20%, 15%, and 10%, respectively.

Figure 17:
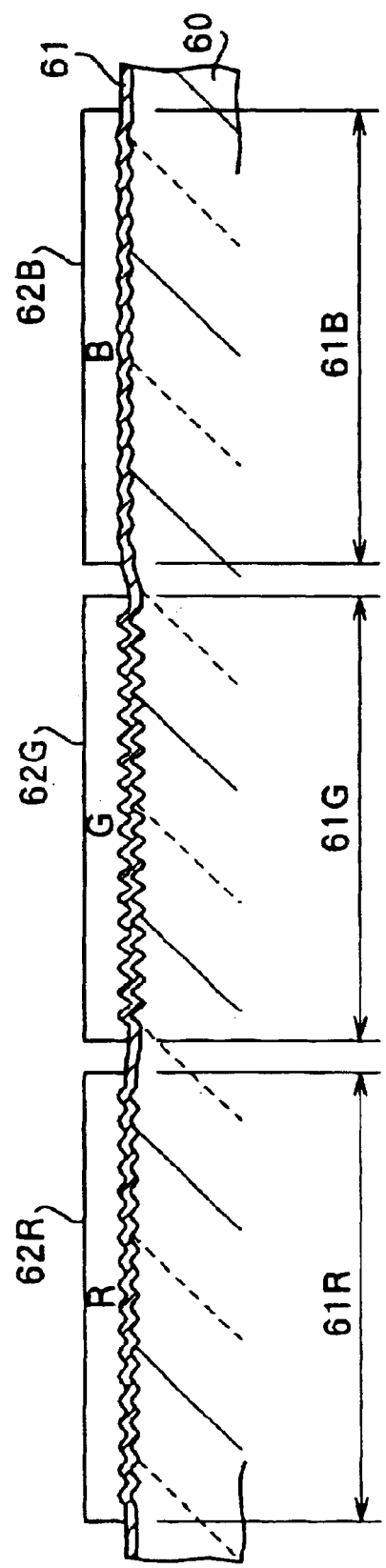
FIG. 17 is a sectional view showing the configuration of the key portion in the case where the second mode is adopted as the surface shape of the reflection layer.

On the other hand, FIG. 17 is a sectional view showing the reflection layer 61 together with the color filter 62 formed on the surface thereof in the case where the aforementioned second mode is adopted as the surface shape of the reflection layer 61. As shown in the aforementioned drawing, regarding this reflection layer 61, the pitches P of the crest portions are nearly the same, for example, 12 μm, over the regions facing the color filters 62R, 62G, and 62B of respective colors. On the other hand, the average value of the depths D of the trough portions vary with respect to each region facing each of the color filters 62R, 62G, and 62B of respective colors.

More specifically, in the reflection layer 61, the average value of the depths D of the trough portions in the region 61B is set at 0.6 μm, the average value of the depths D of the trough portions in the region 61R is set at 0.8 μm, and the average value of the depths D of the trough portions in the region 61G is set at 1.0 μm and, therefore, the mirror reflectivities Rb, Rr, and Rg in respective regions can be set at 20%, 15%, and 10%, respectively.

Since the reflection layer having such a surface shape can be manufactured by a manufacturing process similar to the manufacturing process shown in the aforementioned first embodiment, explanations thereof are omitted in the present embodiment.

As described above, in the present embodiment, effects similar to those in the first embodiment can also be achieved by varying the mirror reflectivity in the reflection layer 61 with respect to each region facing the color filter of each color.

MODIFIED EXAMPLES

The present invention has been described above by using the embodiments. However, the aforementioned embodiments are no more than exemplifications, and various modifications can be applied to the aforementioned embodiments within the scope of the present invention. Conceivable modified examples include, for example, those described below.

Modified Example 1

In the aforementioned each embodiment, the case where the mirror reflectivities of the regions facing to the blue-based, red-based, and green-based color filters in the reflection layer have been set at 20%, 15%, and 10%, respectively, has been exemplified. However, it is needless to say that these values are no more than exemplifications. Therefore, the pitch P of the crest portions, depth D of the trough portion, and inclination α relating to the shape of the reflection layer are not limited to the values exemplified in the aforementioned each embodiment.

For example, in the configuration of the aforementioned each embodiment, as the first mode relating to the surface shape of the reflection layer, the depths D of the trough portions have been set at nearly constant, while the pitches P of the crest portions have been varied with respect to each region facing the color filter of each color. However, the depths D of the trough portions are not necessarily set at nearly constant over the respective regions.

Likewise, in the configuration of the aforementioned each embodiment, as the second mode relating to the surface shape of the reflection layer, the pitches P of the crest portions have been set at nearly constant, while the depths D of the trough portions have been varied with respect to each region facing the color filter of each color. However, the pitches P of the crest portions are not necessarily set at nearly constant over the respective regions. It is essential only that the surface shape of each region is varied in order to vary the mirror reflectivity of the reflection layer with respect to each region facing the color filter of each color.

In the aforementioned each embodiment, the case where the surface shape of the reflection layer is varied with respect to each region facing the color filter of each color has been exemplified. However, this is not always necessary. For example, the spectral luminous efficacy of the human eye with respect to green-based light tends to be remarkably higher than those with respect to blue-based light and red-based light. Consequently, in the reflection layer 22, the surface shapes of the portions facing the blue-based and red-based color filters 12 may be differentiated from the surface shape of the portions facing the green-based color filter while the surface shapes of the portions facing the blue-based and red-based color filters 12 may be nearly the same. That is, it is essential that in the reflection layer, the surface shape of the region facing the color filter of at least one color is different from the surface shapes of the regions facing the color filters of other colors.

Modified Example 2

In the aforementioned each embodiment, the reflective liquid crystal display which performs only reflective display has been exemplified. However, the present invention can be applied to the so-called semitransparent reflective liquid crystal display device which can perform transmissive display in addition to reflective display. That is, in the configuration of this case, instead of the reflection layer in the aforementioned embodiment, a reflection layer including an opening portion for transmitting the incident light from the back side (that is, the second substrate side) or a semitransparent reflective layer (so-called half mirror) which reflects a part of the light reached the surface and transmits the other part is placed and, furthermore, an illumination device is placed on the back side of the liquid crystal display device.

In the aforementioned each embodiment, the liquid crystal display devices of active matrix system using the TFT, which is a three-terminal type nonlinear element, and the TFD, which is a two-terminal type nonlinear element, have been exemplified. However, the present invention can also be applied to the liquid crystal display device of passive matrix system not including these nonlinear elements. Furthermore, in the aforementioned each embodiment, the configuration using the color filters of three colors, R (red base), G (green base), and B (blue base), has been exemplified. However, the color of the color filter is not limited to this. Likewise, regarding the mode of the array of the color filters, various array rules, for example, stripe array, mosaic array, and delta array, can be adopted.

As described above, the present invention can be applied as long as the liquid crystal display device is provided with a reflection layer in which the surface shape of the region facing the color filter of at least one color is different from the surface shapes of the regions facing the color filters of other colors regardless of the mode of other constituents.

Furthermore, the manufacturing processes shown in the aforementioned embodiments are no more than exemplifications. It is needless to say that the method for forming the reflection layer, in which the surface shapes vary on a color filter of each color basis, is not limited to these. For example, in the aforementioned each embodiment, the method for roughening the surface of the resin layer covering the second substrate has been exemplified. However, the surface of the second substrate itself may be roughened, and the reflection layer may be formed on this roughened surface.

Modified Example 3

In the above description, the liquid crystal display device has been exemplified as an example of the electro-optic devices. However, the present invention can be used for arbitrary electro-optic devices other than the liquid crystal display device. Conceivable examples of such an electro-optic device include, for example, electroluminescence devices (EL devices), organic electroluminescence devices (organic EL devices), inorganic electroluminescence devices, plasma display devices, electrophoretic display devices, field emission display devices (Field Emission Display), and LED display devices.

Modified Example 4

In the aforementioned embodiments and modified examples, the color filters of three colors, R (red base), G (green base), and B (blue base), have been used as the color filters. However, not limited to this, the color filters of three colors, C (cyan), M (magenta), and Y (yellow), may be used as the color filters. In this case, the spectral luminous efficacy becomes Y (yellow)>C (cyan)>M (magenta). Therefore, in the present modified example, preferably, the surface shape of each reflection layer may be varied in order that the mirror reflectivity Rc of the reflection layer facing the cyan color filter, the mirror reflectivity Rm of the reflection layer facing the magenta color filter, and the mirror reflectivity Ry of the reflection layer facing the yellow color filter fall within Rm>Rc>Ry.

When Rm>Ry is achieved, difference in the spectral luminous efficacy among cyan, magenta, and yellow can be reduced to some extent. In order to achieve mirror reflectivity Rm>mirror reflectivity Rc>mirror reflectivity Ry as described above, it is essential that the depths of the trough portions are set at a nearly constant value over all reflection layers, while the average value of the pitches Pc of the crest portions in the reflection layer facing the cyan color filter, the average value of the pitches Pm of the crest portions in the reflection layer facing the magenta color filter, and the average value of the pitches Py of the crest portions in the reflection layer facing the yellow color filter are made to fall within Pm>Pc>Py. When the depths of the trough portions are set at a nearly constant value over all reflection layers and Rm>Ry is achieved, difference in the spectral luminous efficacy among cyan, magenta, and yellow can be reduced to some extent.

As another means, in order to achieve mirror reflectivity Rm>mirror reflectivity Rc>mirror reflectivity Ry, it is essential that the pitches P of the crest portions of the reflection layers facing the color filters of respective colors are set at a nearly constant value over all reflection layers, while the average value of the depths Dc of the trough portions in the reflection layer facing the cyan color filter, the average value of the depths Dm of the trough portions in the reflection layer facing the magenta color filter, and the average value of the depths Dy of the trough portions in the reflection layer facing the yellow color filter are made to fall within Dy>Dc>Dm. When the pitches P of the crest portions of the reflection layers facing the color filters of respective colors are set at a nearly constant value over all reflection layers and Dy>Dm is achieved, difference in the spectral luminous efficacy among cyan, magenta, and yellow can be reduced to some extent.

(Electronic Equipment)

Next, electronic equipment using the electro-optic device according to the present invention will be described.

(Mobile Computer)

Figure 18:
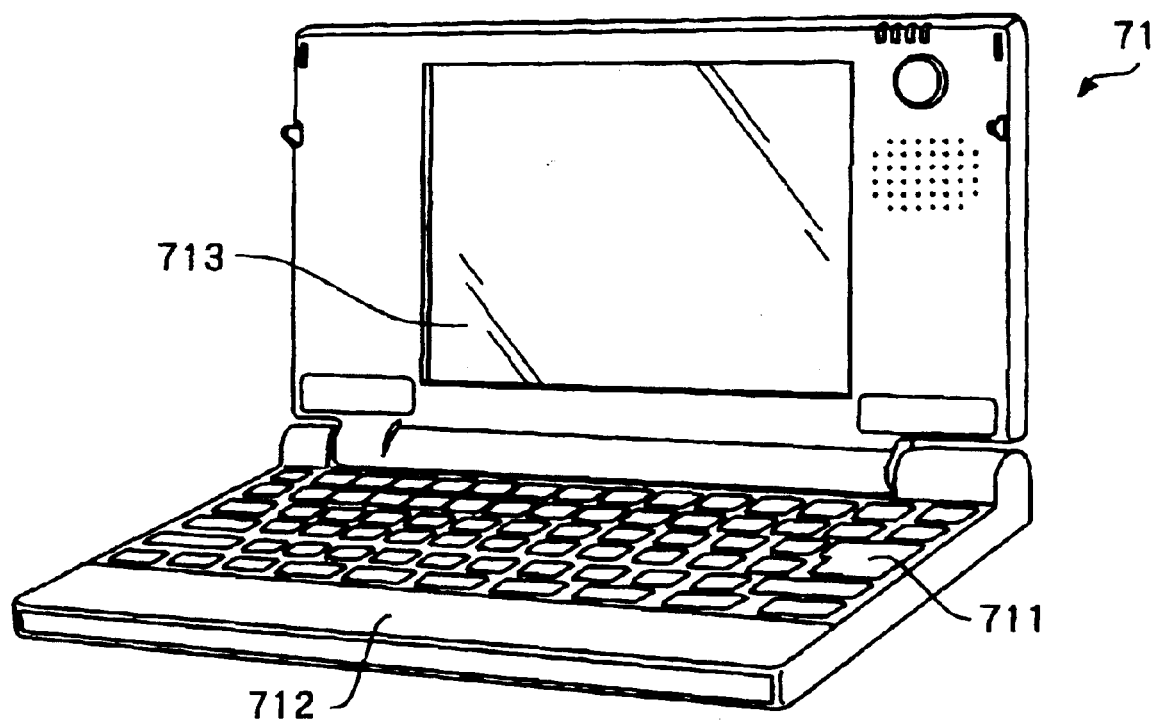
FIG. 18 is a perspective view showing a personal computer as an example of electronic equipment to which the electro-optic device according to the present invention is applied.

An example, in which the electro-optic device according to the present invention is applied to the display portion of a mobile personal computer (so-called notebook personal computer), will be described. FIG. 18 is a perspective view showing the configuration of this personal computer. As shown in the aforementioned drawing, a personal computer 71 is provided with a body portion 712 with a keyboard 711, and a display portion 713 in which the electro-optic device according to the present invention is applied. When a liquid crystal display device is used as the electro-optic device used for this personal computer, in order to ensure the visibility even in a dark place, a semitransparent reflective liquid crystal display device, which can perform not only transmissive display, but also reflective display, is desirable.

(Cellular Phone)

Figure 19:
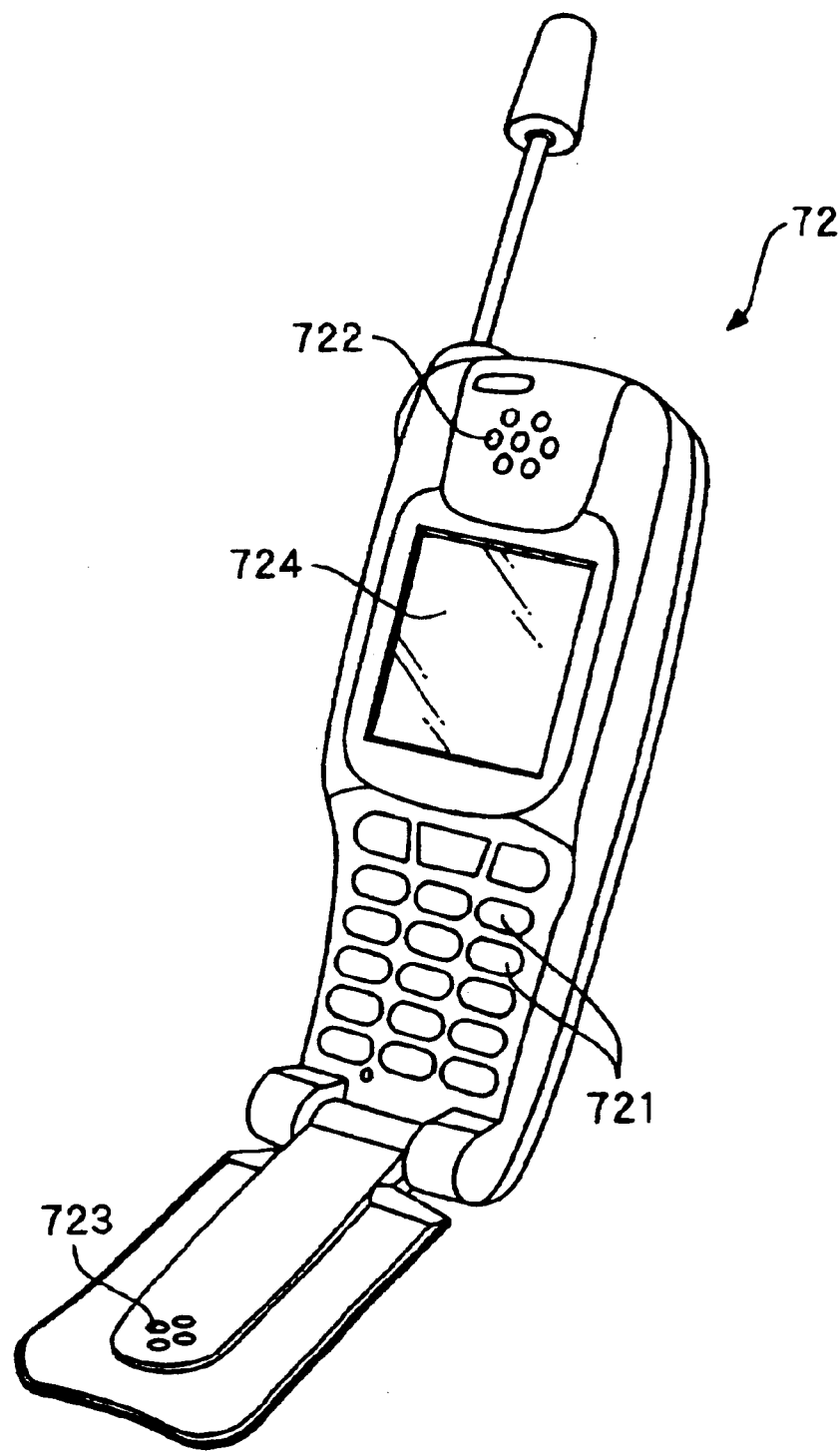
FIG. 19 is a perspective view showing a cellular phone as an example of electronic equipment to which the electro-optic device according to the present invention is applied.

An example, in which the electro-optic device according to the present invention is applied to the display portion of a cellular phone, will be described. FIG. 19 is a perspective view showing the configuration of this cellular phone. As shown in the aforementioned drawing, a cellular phone 72 is provided with a plurality of operation buttons 721, an earpiece 722, a mouthpiece 723, and a display portion 724 in which the electro-optic device according to the present invention is applied. In this embodiment as well, when a liquid crystal display device is used as the electro-optic device, in order to ensure the visibility in a dark place, a semitransparent reflective liquid crystal display device is used desirably as the display portion 724.

Examples of electronic equipment, in which the electro-optic devices according to the present invention can be applied, include, for example, liquid crystal televisions, viewfinder type videotape recorders, monitor-direct-view type videotape recorders, car navigation devices, pagers, electronic notepads, desk-top calculators, word processors, work stations, videophones, POS terminals, and digital still cameras in addition to the personal computer shown in FIG. 18 and the cellular phone shown in FIG. 19.

As described above, since difference in spectral luminous efficacy with respect to the light having each wavelength within the visible-light region can be compensated by the electro-optic device according to the present invention, the color balance of image visually identified by the observer can be ensured by the electronic equipment using this electro-optic device.

As described above, according to the present invention, intensity of the light detected by the observer can be adjusted with respect to each wavelength within the visible-light region. The entire disclosure of Japanese Patent Application Nos. 2001-134500 filed May 1, 2001 and 2001-102946 filed Apr. 4, 2002 are incorporated by reference herein.

What is claimed is:

1. An electro-optic device comprising:
    a plurality of color or filters, each having a different color; and
    a reflection layer having a first region facing at least one of the color filters and other regions facing the other color filters, the first region having a first surface shape, the other regions having other surface shapes, the first surface shape being different from the other surface shapes.

2. The electro-optic device according to claim 1,
    wherein a mirror reflectivity of the first region is different from a mirror reflectivity of the other regions.

3. The electro-optic device according to claim 2,
    wherein a plurality of crest portions and a plurality of trough portions are formed on a surface of the reflection layer, a shape of the plurality of crest portions and the plurality of trough portions in the first region being different from a shape of the plurality of crest portions and the plurality of trough portions in the other regions.

4. The electro-optic device according to claim 3,
    wherein an average pitch distance between a top of one crest portion and a top of another crest portion adjacent to the one crest portion in the first region is different from an average pitch distance in the other regions.

5. The electro-optic device according to claim 4,
    wherein a depth of each trough portion is substantially equal in the first and other regions.

6. The electro-optic device according to claim 3,
    wherein an average depth value of the trough portions in the first region is different from an average depth value in the other regions.

7. The electro-optic device according to claim 6,
    wherein a pitch distance between a top of one crest portion and a top of another crest portion adjacent to the one crest portion is substantially equal in the first and other regions.

8. The electro-optic device according to claim 3,
    where an average inclination value between a surface of a substrate and a direction from a top of the crest portion toward a bottom of the trough portion adjacent to the crest portion in the first region is different from an average inclination value in the other regions.

9. Electronic equipment comprising the electro-optic device according to claim 1.

10. An electro-optic device comprising:
a red-based color filter;
a green-based color filter;
a blue-based color filter; and
a reflection layer including a first region facing the red-based color filter, a second region facing the green-based color filter, and a third region facing the blue-based color filter, wherein:
    a surface shape of the third region is different from each surface shape of the first region and the second region; and
    the mirror reflectivity of the third region is higher than each mirror reflectivity of the first region and the second region.

11. The electro-optic device according to claim 9, wherein the mirror reflectivity of the first region is higher than the mirror reflectivity of the second region.

12. The electro-optic device according to claim 11, wherein:
    a plurality of crest portions and a plurality of trough portions are formed in the first region, the second region, and the third region on a surface of the reflection layer;
    a depth of the trough portions are substantially the same in the first region, the second region, and the third region; and
    an average pitch distance between a top of one crest portion and a top of another crest portion adjacent to the one crest portion in the third region is larger than an average pitch distance in the first region and the second region.

13. The electro-optic device according to claim 12, wherein an average pitch distance in the first region is larger than an average pitch distance in the second region.

14. The electro-optic device according to claim 10, wherein:
    a plurality of crest portions and a plurality of trough portions are formed in the first region, the second region, and the third region on a surface of the reflection layer;
    an average depth value of the trough portions in the third region is smaller than each average depth value of the trough portions in the first region and the second region; and
    a pitch distance between a top of one crest portion and a top of another crest portion adjacent to the one crest portion are substantially equal in the first region, the second region, and the third region.

15. The electro-optic device according to claim 14, wherein the average depth value of the trough portions in the first region is smaller than the average depth value of the trough portions in the second region.

16. The electro-optic device according to claim 14, wherein an average inclination angle between a surface of a substrate and a direction from a top of the crest portions toward a bottom of the trough portions in the third region is smaller than the average inclination angle in the first region and the second region.

17. The electro-optic device according to claim 16, wherein the average inclination angle in the first region is smaller than the average inclination angle in the second region.

18. A manufacturing method for an electro-optic device provided with a surface shape, a reflection layer placed on the surface shape, and a plurality of color filters, each having a different color, placed on the reflection layer, comprising:
    the step of forming the surface shape;
    the step of forming the reflection layer on the surface shape in order to cover the surface shape; and
    the step of forming the plurality of color filters on the reflection layer,
    wherein the surface shape in a first region facing at least one of the color filters and the surface shapes in the other regions facing the other color filters are different.

19. The manufacturing method for an electro-optic device according to claim 18,
    wherein in the step of forming the surface shape:
    a resin layer including a plurality of crest portions and a plurality of trough portions on the surface thereof is formed; and
    the surface shape in the first region and the surface shapes in the other regions are different in the resin layer.

20. The manufacturing method for an electro-optic device according to claim 19,
    wherein in the step of forming the surface shape,
    the resin layer is formed in order that an average pitch distance between atop of one crest portion and a top of another crest portion adjacent to the one crest portion in the first region is different from an average pitch distance in the other regions.

21. The manufacturing method for an electro-optic device according to claim 19,
    wherein in the step of forming the surface shape,
    the resin layer is formed in order that an average depth value of the trough portions in the first region is different from an average depth value in the other regions.

22. An electro-optic device comprising:
red, green and blue color filters; and
a reflection layer having a first region facing the red color filter, a second region facing the green color filter, and a third region facing the blue color filter, the third region having a surface shape which is different from a surface shape of each of the first and second regions;
wherein a mirror reflectivity of each of the first and third regions is greater than a mirror reflectivity of the second region.

23. An electro-optic device comprising:
a red-based color filter;
a green-based color filter;
a blue-based color filter; and
a reflection layer including a first region facing the red-based color filter, a second region facing the green-based color filter, and a third region facing the blue-based color filter, wherein:
    a surface shape of the third region is different from each surface shape of the first region and the second region; and
    a mirror reflectivity of each of the first and third regions is higher than a mirror reflectivity of the second region.

24. An electro-optic device comprising:
cyan, yellow and magenta color filters; and
a reflection layer having a first region facing the cyan color filter, a second region facing the yellow color filter, and a third region facing the magenta color filter, the third region having a surface shape which is different from a surface shape of each of the first and second regions;

wherein a mirror reflectivity of each of the first and third regions is greater than a mirror reflectivity of the second region.

25. An electro-optic device comprising:

a cyan-based color filter;

a yellow-based color filter;

a magenta-based color filter; and a reflection layer including a first region facing the cyan-based color filter, a second region facing the yellow-based color filter, and a third region facing the magenta-based color filter, wherein:
- a surface shape of the third region is different from each surface shape of the first region and the second region; and
- a mirror reflectivity of each of the first and third regions is higher than a mirror reflectivity of the second region.

26. An electro-optic device comprising:

a first color filter having a first spectral luminous efficacy;

a second color filter having a second spectral luminous efficacy, the second spectral luminous efficacy being higher than the first spectral luminous efficacy;

a third color filter having a third spectral luminous efficacy, the third spectral luminous efficacy being lower than the first spectral luminous efficacy;

a reflection layer having a first region facing the first color filter, a second region facing the second color filter, and a third region facing the third color filter, the third region having a surface shape which is different from a surface shape of each of the first and second regions;

wherein a mirror reflectivity of each of the first and third regions is greater than a mirror reflectivity of the second region.

27. An electro-optic device comprising:

a first color filter having a first spectral luminous efficacy;

a second color filter having a second spectral luminous efficacy, the second spectral luminous efficacy being higher than the first spectral luminous efficacy;

a third color filter having a third spectral luminous efficacy, the third spectral luminous efficacy being lower than the first spectral luminous efficacy; and a reflection layer including a first region facing the first color filter, a second region facing the second color filter, and a third region facing the third color filter, wherein:
- a surface shape of the third region is different from each surface shape of the first region and the second region; and
- a mirror reflectivity of each of the first and third regions is higher than a mirror reflectivity of the second region.

* * * * *